US009748535B2

(12) United States Patent
Huang et al.

(10) Patent No.: US 9,748,535 B2
(45) Date of Patent: Aug. 29, 2017

(54) BATTERY PACK AND HOLSTER FOR MOBILE DEVICES

(71) Applicant: Mophie, Inc., Tustin, CA (US)

(72) Inventors: Daniel Huang, Irvine, CA (US); Matthew Brand, Brooklyn, NY (US)

(73) Assignee: mophie, inc., Tustin, CA (US)

( * ) Notice: Subject to any disclaimer, the term of this patent is extended or adjusted under 35 U.S.C. 154(b) by 0 days.

(21) Appl. No.: 14/569,229

(22) Filed: Dec. 12, 2014

(65) Prior Publication Data

US 2015/0140386 A1 May 21, 2015

Related U.S. Application Data

(60) Continuation of application No. 12/938,351, filed on Nov. 2, 2010, now Pat. No. 8,971,039, which is a (Continued)

(51) Int. Cl.

| | |
|---|---|
| ***H02J 7/00*** | (2006.01) |
| ***H01M 2/10*** | (2006.01) |
| ***G06F 1/16*** | (2006.01) |
| ***H04M 1/02*** | (2006.01) |
| ***H01M 10/46*** | (2006.01) |
| ***H01M 10/48*** | (2006.01) |

(Continued)

(52) U.S. Cl.

CPC ...... *H01M 2/1022* (2013.01); *G01R 31/3606* (2013.01); *G06F 1/1626* (2013.01); *G06F 1/1632* (2013.01); *H01M 10/46* (2013.01); *H01M 10/488* (2013.01); *H02J 7/0042* (2013.01); *H02J 7/0044* (2013.01); *H02J 7/0045* (2013.01); *H02J 7/0047* (2013.01); *H02J 7/0052* (2013.01); *H04B 1/3883* (2013.01); *H04B 1/3888* (2013.01); *H04M 1/0254* (2013.01); *H04M 1/0262* (2013.01); *H04M 1/0283* (2013.01); *H01M 2220/30* (2013.01); *H02J 2007/005* (2013.01); *H02J 2007/0062* (2013.01); *Y10T 29/49108* (2015.01)

(58) Field of Classification Search

CPC .............................. H02J 7/0044; H02J 7/0045
USPC ................................ 320/103, 107, 114, 115
See application file for complete search history.

(56) References Cited

U.S. PATENT DOCUMENTS 3,851,126 A 11/1974 Keller
4,028,515 A 6/1977 Desio et al.
(Continued)

FOREIGN PATENT DOCUMENTS

CN 201252577 Y 6/2009
CN 202364273 U 8/2012
(Continued)

OTHER PUBLICATIONS

Reexamination Control No. 90/013,319 including its prosecution history, filing date Sep. 18, 2014, Huang et al.
(Continued)

*Primary Examiner* — Arun Williams
*Assistant Examiner* — Aaron Piggush
(74) *Attorney, Agent, or Firm* — Knobbe, Martens, Olson & Bear, LLP

(57) ABSTRACT

Embodiments of this disclosure relate to battery packs and/or holsters and, more particular, to an external battery pack and/or holster for mobile electronic devices.

23 Claims, 25 Drawing Sheets

1002 1004 1016 1014 1204 1208 1202

Related U.S. Application Data division of application No. 12/357,262, filed on Jan. 21, 2009, now Pat. No. 8,367,235.

(60) Provisional application No. 61/021,897, filed on Jan. 18, 2008.

(51) Int. Cl.
*G01R 31/36* (2006.01)
*H04B 1/3883* (2015.01)
*H04B 1/3888* (2015.01)

(56) References Cited

U.S. PATENT DOCUMENTS

D267,795 S 2/1983 Mallon
4,479,596 A 10/1984 Swanson
4,515,272 A 5/1985 Newhouse
D284,372 S 6/1986 Carpenter
4,951,817 A 8/1990 Barletta et al.
D312,534 S 12/1990 Nelson et al.
5,001,772 A 3/1991 Holcomb et al.
D322,719 S 12/1991 Jayez
D327,868 S 7/1992 Oka
5,360,108 A 11/1994 Alagia
5,368,159 A 11/1994 Doria
5,383,091 A 1/1995 Snell
5,386,084 A 1/1995 Risko
5,508,123 A 4/1996 Fan
D372,896 S 8/1996 Nagele et al.
5,586,002 A 12/1996 Notarianni
5,604,050 A 2/1997 Brunette et al.
5,610,979 A 3/1997 Yu
D384,327 S 9/1997 Nakui
5,708,707 A 1/1998 Halttlunen et al.
5,711,013 A 1/1998 Collett et al.
D392,248 S 3/1998 Johansson
D392,939 S 3/1998 Finke-Anlauff
5,786,106 A 7/1998 Armani
5,816,459 A 10/1998 Armistead
D400,495 S 11/1998 Deslyper et al.
D400,496 S 11/1998 Barber et al.
5,859,481 A 1/1999 Banyas
5,864,766 A 1/1999 Chiang
D405,801 S 2/1999 Nagele et al.
D407,063 S 3/1999 Reis et al.
5,876,351 A 3/1999 Rohde
D407,708 S 4/1999 Nagele et al.
5,896,277 A 4/1999 Leon et al.
5,932,855 A 8/1999 Wang et al.
5,959,433 A 9/1999 Rohde
5,973,477 A 10/1999 Chang
D417,189 S 11/1999 Amero, Jr. et al.
6,043,626 A 3/2000 Snyder et al.
D424,512 S 5/2000 Ho
6,069,332 A 5/2000 Suchanek et al.
6,081,595 A 6/2000 Picaud
D428,019 S 7/2000 Amron
6,082,535 A 7/2000 Mitchell
6,171,138 B1 1/2001 Lefebvre et al.
D438,004 S 2/2001 Watson et al.
6,184,654 B1 2/2001 Bachner, III et al.
D439,218 S 3/2001 Yu
6,201,867 B1 3/2001 Koike
6,208,115 B1 3/2001 Binder
6,266,539 B1 7/2001 Pardo
D446,497 S 8/2001 Yu
6,273,252 B1 8/2001 Mitchell
D447,462 S 9/2001 Kosiba
6,313,982 B1 11/2001 Hino
6,317,313 B1 11/2001 Mosgrove et al.
6,324,380 B1 11/2001 Kiuchi et al.
6,346,791 B1 2/2002 Barguirdjian
6,405,056 B1 6/2002 Altschul et al.
D460,411 S 7/2002 Wang
D460,761 S 7/2002 Croley
6,415,138 B2 7/2002 Sirola et al.
6,445,577 B1 9/2002 Madsen et al.
6,471,056 B1 10/2002 Tzeng
D469,427 S 1/2003 Ma et al.
6,536,589 B2 3/2003 Chang
6,538,413 B1 3/2003 Beard et al.
D472,384 S 4/2003 Richardson
6,552,513 B1 4/2003 Li
6,555,990 B1 4/2003 Yang
6,583,601 B2 6/2003 Simoes et al.
6,594,472 B1 7/2003 Curtis et al.
6,614,722 B2 9/2003 Polany et al.
6,626,362 B1 9/2003 Steiner et al.
D481,716 S 11/2003 He et al.
D482,529 S 11/2003 Hardigg et al.
6,646,864 B2 11/2003 Richardson
D484,874 S 1/2004 Chang et al.
D485,834 S 1/2004 Davetas
6,681,003 B2 1/2004 Linder et al.
6,701,159 B1 3/2004 Powell
6,708,887 B1 3/2004 Garrett et al.
6,714,802 B1 3/2004 Barvesten
6,785,566 B1 8/2004 Irizarry
6,819,549 B1 11/2004 Lammers-Meis et al.
D500,041 S 12/2004 Tsujimoto
D506,612 S 6/2005 Rosa et al.
D508,495 S 8/2005 Bone et al.
D513,123 S 12/2005 Richardson et al.
6,980,777 B2 12/2005 Shepherd et al.
D513,451 S 1/2006 Richardson et al.
6,992,461 B2 1/2006 Liang et al.
D514,808 S 2/2006 Morine et al.
D516,309 S 3/2006 Richardson et al.
D516,553 S 3/2006 Richardson et al.
D516,554 S 3/2006 Richardson et al.
D516,807 S 3/2006 Richardson et al.
D517,007 S 3/2006 Yong-Jian et al.
D520,744 S 5/2006 Pangrec et al.
7,050,841 B1 5/2006 Onda
7,069,063 B2 6/2006 Halkosaari et al.
D525,582 S 7/2006 Chan
7,072,699 B2 7/2006 Eiden
7,079,879 B1 7/2006 Sylvester et al.
7,081,736 B2 7/2006 Seil et al.
D526,780 S 8/2006 Richardson et al.
D526,958 S 8/2006 Shimizu
D530,079 S 10/2006 Thomas et al.
D535,252 S 1/2007 Sandnes
7,158,376 B2 1/2007 Richardson et al.
7,166,987 B2 1/2007 Lee et al.
D537,063 S 2/2007 Kim et al.
7,180,735 B2 2/2007 Thomas et al.
7,180,754 B2 2/2007 Qin et al.
7,194,291 B2 3/2007 Peng
D540,539 S 4/2007 Gutierrez
7,203,467 B2 4/2007 Siddiqui
D542,286 S 5/2007 Taniyama et al.
D542,524 S 5/2007 Richardson et al.
D543,541 S 5/2007 Chung et al.
D544,486 S 6/2007 Hussaini et al.
7,230,823 B2 6/2007 Richardson et al.
D547,056 S 7/2007 Griffin et al.
D547,057 S 7/2007 Griffin et al.
D550,455 S 9/2007 Barnhart
D551,252 S 9/2007 Andre et al.
7,266,391 B2 9/2007 Warren
D551,856 S 10/2007 Ko et al.
D553,857 S 10/2007 Pendergraph et al.
D556,679 S 12/2007 Weinstein et al.
D556,681 S 12/2007 Kim
D557,205 S 12/2007 Kim
D557,264 S 12/2007 Richardson et al.
D557,494 S 12/2007 Mayette et al.
D557,897 S 12/2007 Richardson et al.
7,312,984 B2 12/2007 Richardson et al.
D558,667 S 1/2008 Park et al.
D558,757 S 1/2008 Andre et al.
D558,972 S 1/2008 Oh
D558,973 S 1/2008 Hussaini et al.

(56) References Cited

U.S. PATENT DOCUMENTS

D559,267 S 1/2008 Griffin
D560,229 S 1/2008 Yagi
D561,092 S 2/2008 Kim
7,336,973 B2 2/2008 Goldthwaite et al.
D563,093 S 3/2008 Nussberger
7,343,184 B2 3/2008 Rostami
D565,291 S 4/2008 Brandenburg et al.
7,397,658 B2 7/2008 Finke-Anlauff et al.
7,400,917 B2 7/2008 Wood et al.
D574,326 S 8/2008 Lim
D574,819 S 8/2008 Andre et al.
D575,056 S 8/2008 Tan
7,428,427 B2 9/2008 Brunstrom et al.
D577,904 S 10/2008 Sasaki
D581,151 S 11/2008 Aipa
D581,155 S 11/2008 Richardson et al.
D581,421 S 11/2008 Richardson et al.
D582,149 S 12/2008 Tan
7,464,814 B2 12/2008 Carnevali
D584,732 S 1/2009 Cho et al.
7,479,759 B2 1/2009 Vilanov et al.
D587,008 S 2/2009 Richardson et al.
D587,896 S 3/2009 Aipa
D589,016 S 3/2009 Richardson et al.
D589,953 S 4/2009 Turner
7,536,099 B2 5/2009 Dalby et al.
D593,319 S 6/2009 Richardson et al.
D593,746 S 6/2009 Richardson et al.
D594,849 S 6/2009 Ko
7,555,325 B2 6/2009 Goros
D597,089 S 7/2009 Khan et al.
7,562,813 B2 7/2009 Humphrey et al.
D597,301 S 8/2009 Richardson et al.
D598,407 S 8/2009 Richardson et al.
7,577,462 B2 8/2009 Kumar
D600,640 S 9/2009 Stein et al.
D600,908 S 9/2009 Richardson et al.
D601,955 S 10/2009 Ekmekdje
D601,959 S 10/2009 Lee et al.
D601,960 S 10/2009 Dai
7,609,512 B2 10/2009 Richardson et al.
D603,602 S 11/2009 Richardson et al.
D603,603 S 11/2009 Laine et al.
7,612,997 B1 11/2009 Diebel et al.
D605,850 S 12/2009 Richardson et al.
D606,528 S 12/2009 Khan et al.
D606,529 S 12/2009 Ferrari et al.
7,635,086 B2 12/2009 Spencer, II
7,638,969 B2 12/2009 Woud
7,647,082 B2 1/2010 Holmberg
D609,228 S 2/2010 Ferrari et al.
D609,463 S 2/2010 Bullen
D610,538 S 2/2010 Wu et al.
7,656,120 B2 2/2010 Neu et al.
7,663,878 B2 2/2010 Swan et al.
7,667,433 B1 2/2010 Smith
D610,807 S 3/2010 Bau
D611,042 S 3/2010 Ferrari et al.
D611,478 S 3/2010 Richardson et al.
7,669,829 B2 * 3/2010 Ogatsu .......................... 248/682
D613,282 S 4/2010 Richardson et al.
D615,077 S 5/2010 Richardson et al.
D615,535 S 5/2010 Richardson et al.
D615,536 S 5/2010 Richardson et al.
D615,967 S 5/2010 Richardson et al.
D616,360 S 5/2010 Huang
D616,361 S 5/2010 Huang
D617,753 S 6/2010 Cheng
D617,784 S 6/2010 Richardson et al.
D617,785 S 6/2010 Richardson et al.
D617,786 S 6/2010 Richardson et al.
D617,787 S 6/2010 Richardson et al.
D618,231 S 6/2010 Fahrendorff et al.
7,733,637 B1 6/2010 Lam
D619,573 S 7/2010 Khan et al.
D619,574 S 7/2010 Richardson et al.
D619,991 S 7/2010 Huang
D620,000 S 7/2010 Bau
D620,487 S 7/2010 Richardson et al.
D621,394 S 8/2010 Richardson et al.
D621,395 S 8/2010 Richardson et al.
D621,821 S 8/2010 Richardson et al.
D621,822 S 8/2010 Richardson et al.
7,778,023 B1 8/2010 Mohoney
7,782,610 B2 8/2010 Diebel et al.
D623,179 S 9/2010 Richardson et al.
D623,180 S 9/2010 Diebel
D623,638 S 9/2010 Richardson et al.
D623,639 S 9/2010 Richardson et al.
D623,640 S 9/2010 Freeman
D624,317 S 9/2010 Wenchel et al.
D624,533 S 9/2010 Richardson et al.
D624,908 S 10/2010 Huskinson
D624,909 S 10/2010 Huskinson
D624,910 S 10/2010 Richardson et al.
D625,303 S 10/2010 Kim
D626,120 S 10/2010 Richardson et al.
D626,121 S 10/2010 Richardson et al.
D626,538 S 11/2010 Brown et al.
D626,539 S 11/2010 Brown et al.
D626,540 S 11/2010 Brown et al.
D626,964 S 11/2010 Richardson et al.
D628,568 S 12/2010 Richardson et al.
D628,994 S 12/2010 Griffin, Jr. et al.
7,859,222 B2 12/2010 Woud
D631,246 S 1/2011 Boettner
7,863,856 B2 1/2011 Sherman et al.
7,863,862 B2 1/2011 Idzik et al.
D631,877 S 2/2011 Rak et al.
D632,648 S 2/2011 Yang
D632,683 S 2/2011 Richardson et al.
D632,684 S 2/2011 Richardson et al.
D632,685 S 2/2011 Richardson et al.
D632,686 S 2/2011 Magness et al.
7,889,489 B2 2/2011 Richardson et al.
7,889,498 B2 2/2011 Diebel et al.
D634,704 S 3/2011 Tieleman et al.
D634,741 S 3/2011 Richardson et al.
7,899,397 B2 3/2011 Kumar
7,907,394 B2 3/2011 Richardson et al.
7,911,530 B2 3/2011 Sawachi
D636,386 S 4/2011 Richardson et al.
D636,387 S 4/2011 Willes et al.
7,930,011 B2 4/2011 Shi et al.
7,933,122 B2 4/2011 Richardson et al.
D637,588 S 5/2011 Richardson et al.
D637,589 S 5/2011 Willes et al.
D637,590 S 5/2011 Michie et al.
D637,591 S 5/2011 Willes et al.
D637,592 S 5/2011 Magness et al.
D637,952 S 5/2011 Tan
D638,005 S 5/2011 Richardson et al.
D638,411 S 5/2011 Willes et al.
D638,413 S 5/2011 Magness et al.
D638,414 S 5/2011 Magness et al.
D638,828 S 5/2011 Melanson et al.
D638,829 S 5/2011 Melanson et al.
D638,830 S 5/2011 Magness et al.
D639,731 S 6/2011 Sun
D640,679 S 6/2011 Willes et al.
D640,680 S 6/2011 Magness et al.
7,957,524 B2 6/2011 Chipping
D641,013 S 7/2011 Richardson et al.
D641,014 S 7/2011 Smith et al.
D641,974 S 7/2011 Stampfli
D642,170 S 7/2011 Johnson et al.
D642,171 S 7/2011 Melanson et al.
D642,558 S 8/2011 Magness
D643,029 S 8/2011 Feng
D643,424 S 8/2011 Richardson et al.
D644,215 S 8/2011 Dong
D644,216 S 8/2011 Richardson et al.
D644,219 S 8/2011 Sawada
7,988,010 B2 8/2011 Yang et al.

(56) References Cited

U.S. PATENT DOCUMENTS 8,004,962 B2 8/2011 Yang et al.
D644,635 S 9/2011 Richardson et al.
D644,639 S 9/2011 Weller et al.
D647,084 S 10/2011 Fathollahi
D647,108 S 10/2011 Lee
8,028,794 B1 10/2011 Freeman
8,046,039 B2 10/2011 Lee et al.
D648,714 S 11/2011 Jones, III et al.
D648,715 S 11/2011 Jones, III et al.
D648,716 S 11/2011 Jones, III et al.
D648,717 S 11/2011 Fahrendorff et al.
D649,143 S 11/2011 Jones, III et al.
D649,539 S 11/2011 Hong
D650,810 S 12/2011 Lemelman et al.
D652,827 S 1/2012 Fahrendorff et al.
D652,828 S 1/2012 Fahrendorff et al.
D653,202 S 1/2012 Hasbrook et al.
D653,659 S 2/2012 Fahrendorff et al.
D654,069 S 2/2012 Kwon
D654,483 S 2/2012 Richardson et al.
D654,931 S 2/2012 Lemelman et al.
D655,281 S 3/2012 Turocy
D655,699 S 3/2012 Bau
D656,495 S 3/2012 Andre et al.
D658,165 S 4/2012 Freeman
8,150,485 B2 4/2012 Lee
D658,643 S 5/2012 Fahrendorff et al.
8,167,127 B2 5/2012 Martin et al.
D662,923 S 7/2012 Piedra et al.
D663,263 S 7/2012 Gupta et al.
D663,319 S 7/2012 Chen et al.
D663,724 S 7/2012 Lee
D664,091 S 7/2012 Pliner et al.
8,224,408 B2 7/2012 Tomasini et al.
D665,386 S 8/2012 Fathollahi
D665,735 S 8/2012 Kang et al.
8,245,842 B2 8/2012 Bau
8,247,102 B2 8/2012 Hua
D667,783 S 9/2012 Zhang et al.
D670,281 S 11/2012 Corpuz et al.
D670,689 S 11/2012 Wang
D671,105 S 11/2012 Rothbaum et al.
D671,106 S 11/2012 Rothbaum et al.
D671,493 S 11/2012 Hasbrook et al.
8,321,619 B2 11/2012 Kular et al.
8,328,008 B2 12/2012 Diebel et al.
D674,394 S 1/2013 Kajimoto
8,342,325 B2 1/2013 Rayner
D675,603 S 2/2013 Melanson et al.
D676,032 S 2/2013 Stump et al.
D676,432 S 2/2013 Hasbrook et al.
8,367,235 B2 2/2013 Huang et al.
8,380,264 B2 2/2013 Hung et al.
D677,249 S 3/2013 Li et al.
D678,869 S 3/2013 Diebel
8,390,255 B1 3/2013 Fathollahi
8,393,466 B2 3/2013 Rayner
D679,271 S 4/2013 Liu
D679,684 S 4/2013 Baker et al.
D679,699 S 4/2013 Piedra et al.
D681,020 S 4/2013 Magness et al.
D682,196 S 5/2013 Leung
D682,815 S 5/2013 Chang
D683,338 S 5/2013 Wilson et al.
8,439,191 B1 5/2013 Lu
8,452,242 B2 5/2013 Spencer, II
D684,554 S 6/2013 Park
8,457,701 B2 6/2013 Diebel
D685,356 S 7/2013 Diebel
D686,152 S 7/2013 Lee et al.
D686,586 S 7/2013 Cho
D686,606 S 7/2013 Hong
8,483,758 B2 7/2013 Huang
D687,426 S 8/2013 Requa
D688,233 S 8/2013 Dong
8,499,933 B2 8/2013 Ziemba
8,505,718 B2 8/2013 Griffin, Jr. et al.
8,509,864 B1 8/2013 Diebel
8,509,865 B1 8/2013 LaColla et al.
8,531,833 B2 9/2013 Diebel et al.
D691,990 S 10/2013 Rayner
8,560,014 B1 10/2013 Hu et al.
D693,801 S 11/2013 Rayner
8,579,172 B2 11/2013 Monaco et al.
D696,234 S 12/2013 Wright
D697,502 S 1/2014 Chu et al.
D698,774 S 2/2014 Wardy
D703,652 S 4/2014 Melanson et al.
D704,182 S 5/2014 Smith
D704,688 S 5/2014 Reivo et al.
D706,255 S 6/2014 Akana et al.
D706,256 S 6/2014 Ward et al.
D706,272 S 6/2014 Poon
D709,058 S 7/2014 Hemesath et al.
D709,439 S 7/2014 Ferber et al.
D709,485 S 7/2014 Bishop
D710,344 S 8/2014 Smith et al.
D710,795 S 8/2014 Gupta et al.
D710,839 S 8/2014 Chang
D711,312 S 8/2014 Tien
D711,362 S 8/2014 Poon
D711,863 S 8/2014 Wen
D714,274 S 9/2014 Jung
D714,278 S 9/2014 Case et al.
8,837,156 B2 9/2014 Sun et al.
D716,784 S 11/2014 Wen
D716,785 S 11/2014 White
D718,291 S 11/2014 Hong
D720,738 S 1/2015 Rodriguez et al.
D720,740 S 1/2015 Wicks et al.
D722,312 S 2/2015 Tages et al.
D723,018 S 2/2015 White
D724,574 S 3/2015 Williams
D725,091 S 3/2015 Wen
8,971,039 B2 3/2015 Huang et al.
D728,468 S 5/2015 Ferber et al.
D738,365 S 9/2015 Melanson et al.
D739,394 S 9/2015 Rayner et al.
D740,797 S 10/2015 Daniel
D741,844 S 10/2015 Rayner et al.
D744,472 S 12/2015 Lerenthal
D744,989 S 12/2015 Lee
D744,993 S 12/2015 Diebel
D744,995 S 12/2015 Lerenthal
D746,273 S 12/2015 Herbst
D746,275 S 12/2015 Mohammad
D746,801 S 1/2016 Pan
D748,612 S 2/2016 Chan et al.
D749,557 S 2/2016 Feng
D751,058 S 3/2016 Cocchia et al.
D751,059 S 3/2016 Cocchia et al.
D751,542 S 3/2016 Daniel
9,313,305 B1 4/2016 Diebel
2001/0054148 A1 12/2001 Hoornaert et al.
2002/0065054 A1 5/2002 Humphreys et al.
2002/0111189 A1 8/2002 Chou
2002/0147035 A1 10/2002 Su
2002/0193136 A1 12/2002 Halkosaari et al.
2002/0197965 A1 12/2002 Peng
2003/0000984 A1 1/2003 Vick, III
2003/0096642 A1 5/2003 Bessa et al.
2003/0151890 A1 8/2003 Huang et al.
2003/0217210 A1 11/2003 Carau, Sr.
2003/0218445 A1 11/2003 Behar
2003/0228866 A1 12/2003 Pezeshki
2004/0096054 A1 5/2004 Nuovo
2004/0097256 A1 5/2004 Kujawski
2004/0104268 A1 6/2004 Bailey
2004/0247113 A1 12/2004 Akatsu
2004/0268005 A1 12/2004 Dickie
2005/0049016 A1 3/2005 Cho et al.
2005/0088141 A1 4/2005 Lee et al.
2005/0090301 A1 4/2005 Lange et al.
2005/0093510 A1 5/2005 Seil et al.

(56) References Cited

U.S. PATENT DOCUMENTS

2005/0116684 A1 6/2005 Kim
2005/0130721 A1 6/2005 Gartrell
2005/0231159 A1 10/2005 Jones et al.
2005/0247787 A1 11/2005 Von Mueller et al.
2005/0248312 A1 11/2005 Cao et al.
2005/0286212 A1 12/2005 Brignone et al.
2006/0003709 A1 1/2006 Wood
2006/0010588 A1 1/2006 Schuster et al.
2006/0052064 A1 3/2006 Goradesky
2006/0058073 A1* 3/2006 Kim .............................. 455/573
2006/0063569 A1 3/2006 Jacobs et al.
2006/0099999 A1 5/2006 Park
2006/0105722 A1 5/2006 Kumar
2006/0105824 A1 5/2006 Kim et al.
2006/0125445 A1 6/2006 Cao et al.
2006/0140461 A1 6/2006 Kim
2006/0197674 A1 9/2006 Nakajima
2006/0205447 A1 9/2006 Park et al.
2006/0255493 A1 11/2006 Fouladpour
2007/0004450 A1 1/2007 Parikh
2007/0019804 A1 1/2007 Kramer
2007/0093140 A1 4/2007 Begic et al.
2007/0123316 A1 5/2007 Little
2007/0142097 A1 6/2007 Hamasaki et al.
2007/0152633 A1* 7/2007 Lee .............................. 320/114
2007/0161404 A1 7/2007 Yasujima et al.
2007/0167190 A1 7/2007 Moosavi et al.
2007/0187563 A1* 8/2007 Ogatsu ................ B60R 11/0241 248/346.03
2007/0223182 A1 9/2007 Swan et al.
2007/0225031 A1 9/2007 Bodkin et al.
2007/0236180 A1* 10/2007 Rodgers ................ H02J 7/0044 320/115
2007/0261978 A1 11/2007 Sanderson
2007/0262134 A1 11/2007 Humphrey et al.
2007/0297149 A1 12/2007 Richardson et al.
2008/0007214 A1 1/2008 Cheng
2008/0026794 A1 1/2008 Warren
2008/0026803 A1 1/2008 Demuynck
2008/0032758 A1 2/2008 Rostami
2008/0053770 A1 3/2008 Tynyk
2008/0058010 A1 3/2008 Lee
2008/0096620 A1 4/2008 Lee et al.
2008/0108395 A1 5/2008 Lee et al.
2008/0119244 A1 5/2008 Malhotra
2008/0123287 A1 5/2008 Rossell et al.
2008/0132289 A1 6/2008 Wood et al.
2008/0139258 A1 6/2008 Park et al.
2008/0150367 A1 6/2008 Oh et al.
2009/0009945 A1 1/2009 Johnson et al.
2009/0017883 A1 1/2009 Lin
2009/0051319 A1 2/2009 Fang et al.
2009/0069050 A1 3/2009 Jain et al.
2009/0073650 A1 3/2009 Huang et al.
2009/0096417 A1 4/2009 Idzik et al.
2009/0108800 A1 4/2009 Woud
2009/0111543 A1 4/2009 Tai et al.
2009/0114556 A1 5/2009 Tai et al.
2009/0117955 A1 5/2009 Lo
2009/0128092 A1 5/2009 Woud
2009/0143104 A1 6/2009 Loh et al.
2009/0144456 A1 6/2009 Gelf et al.
2009/0146898 A1 6/2009 Akiho et al.
2009/0152089 A1 6/2009 Hanes
2009/0160399 A1 6/2009 Woud
2009/0160400 A1 6/2009 Woud
2009/0181729 A1 7/2009 Griffin, Jr. et al.
2009/0205983 A1 8/2009 Estlander
2009/0247244 A1 10/2009 Mittleman et al.
2009/0284216 A1 11/2009 Bessa et al.
2009/0301289 A1 12/2009 Gynes
2009/0312058 A9 12/2009 Wood et al.
2009/0314400 A1 12/2009 Liu
2009/0325657 A1 12/2009 Ramsdell et al.
2010/0005225 A1 1/2010 Honda et al.
2010/0013431 A1 1/2010 Liu
2010/0022277 A1 1/2010 An et al.
2010/0026589 A1 2/2010 Dou et al.
2010/0048267 A1 2/2010 Lin
2010/0056054 A1 3/2010 Yamato et al.
2010/0064883 A1 3/2010 Gynes
2010/0078343 A1 4/2010 Hoellwarth et al.
2010/0088439 A1 4/2010 Ang et al.
2010/0093412 A1 4/2010 Serra et al.
2010/0096284 A1 4/2010 Bau
2010/0113106 A1 5/2010 Supran
2010/0132724 A1 6/2010 Seidel et al.
2010/0154062 A1 6/2010 Baram et al.
2010/0195279 A1 8/2010 Michael
2010/0200456 A1 8/2010 Parkinson
2010/0203931 A1 8/2010 Hynecek et al.
2010/0224519 A1 9/2010 Kao
2010/0243516 A1 9/2010 Martin et al.
2010/0302716 A1 12/2010 Gandhi
2010/0328203 A1 12/2010 Hsu
2011/0021255 A1 1/2011 Kim et al.
2011/0034221 A1 2/2011 Hung et al.
2011/0049005 A1 3/2011 Wilson et al.
2011/0055447 A1 3/2011 Costa
2011/0084081 A1 4/2011 Chung et al.
2011/0090626 A1 4/2011 Hoellwarth et al.
2011/0117974 A1 5/2011 Spitalnik et al.
2011/0136555 A1 6/2011 Ramies et al.
2011/0159324 A1 6/2011 Huang et al.
2011/0199041 A1 8/2011 Yang
2011/0253569 A1 10/2011 Lord
2011/0259664 A1 10/2011 Freeman
2011/0261511 A1 10/2011 Alderson et al.
2011/0287726 A1 11/2011 Huang
2011/0297578 A1 12/2011 Stiehl et al.
2011/0309728 A1 12/2011 Diebel
2012/0013295 A1 1/2012 Yeh
2012/0071214 A1 3/2012 Ash, Jr. et al.
2012/0088555 A1 4/2012 Hu
2012/0088558 A1 4/2012 Song
2012/0115551 A1 5/2012 Cho et al.
2012/0122520 A1 5/2012 Phillips
2012/0161696 A1 6/2012 Cook et al.
2012/0177967 A1 7/2012 Wang
2012/0209745 A1 8/2012 Spencer, II
2012/0282977 A1 11/2012 Haleluk
2012/0303520 A1 11/2012 Huang
2012/0320501 A1 12/2012 Ackloo
2012/0325637 A1 12/2012 Kikuchi
2013/0023313 A1 1/2013 Kim
2013/0045775 A1 2/2013 Heywood
2013/0084799 A1 4/2013 Marholev et al.
2013/0098790 A1 4/2013 Hong
2013/0125251 A1 5/2013 Johnson
2013/0189923 A1 7/2013 Lewin
2013/0210475 A1 8/2013 Nylund
2013/0248339 A1 9/2013 Koepsell
2013/0273983 A1 10/2013 Hsu
2013/0307818 A1 11/2013 Pope et al.
2013/0314030 A1 11/2013 Fathollahi
2013/0314880 A1 11/2013 Sun et al.
2013/0318282 A1 11/2013 Wakutsu et al.
2014/0035511 A1 2/2014 Ferber et al.
2014/0065948 A1 3/2014 Huang
2014/0069825 A1 3/2014 Macrina et al.
2014/0165379 A1 6/2014 Diebel et al.
2014/0239916 A1 8/2014 To et al.
2014/0375182 A1 12/2014 Li et al.
2015/0072744 A1 3/2015 Huang
2015/0141090 A1 5/2015 Hwan et al.
2015/0148093 A1 5/2015 Huang et al.
2015/0194648 A1 7/2015 Fathollahi et al.
2015/0281410 A1 10/2015 Takahashi
2015/0295439 A1 10/2015 Huang et al.
2015/0381226 A1 12/2015 Mogol
2016/0004896 A1 1/2016 Pope et al.
2016/0064962 A1 3/2016 Huang et al.

(56) References Cited

U.S. PATENT DOCUMENTS

| | | | |
|---|---|---|---|
| 2016/0064963 | A1 | 3/2016 | Huang et al. |
| 2016/0064979 | A1 | 3/2016 | Huang et al. |
| 2016/0112085 | A1 | 4/2016 | Johnson |

FOREIGN PATENT DOCUMENTS

| | | | |
|---|---|---|---|
| CN | 202535667 | U | 11/2012 |
| CN | 302510329 | S | 7/2013 |
| CN | 302573150 | S | 9/2013 |
| EP | 1732291 | A1 | 12/2006 |
| JP | 8-18637 | | 1/1996 |
| JP | 2000-175720 | | 6/2000 |
| KR | 10-2005-0027961 | | 3/2005 |
| KR | 10-2008-0017688 | | 2/2008 |
| KR | 20-2010-0005030 | | 5/2010 |
| KR | 10-2010-0132724 | | 12/2010 |
| KR | 10-2011-0005507 | | 1/2011 |
| KR | 10-2011-0062089 | | 6/2011 |
| KR | 30-0650361 | | 7/2012 |
| TW | D150044 | | 11/2012 |
| TW | D156538 | | 10/2013 |
| WO | WO 95/15619 | | 6/1995 |
| WO | WO 97/33497 | | 9/1997 |
| WO | WO 03/065227 | A1 | 8/2003 |
| WO | WO 2008/151362 | A2 | 12/2008 |

OTHER PUBLICATIONS

U.S. Appl. No. 14/494,348 including its prosecution history, filed Sep. 23, 2014, Huang et al.

U.S. Appl. No. 14/517,492 including its prosecution history, filed Oct. 17, 2014, Huang et al.

U.S. Appl. No. 14/517,428 including its prosecution history, filed Oct. 17, 2014, Huang et al.

U.S. Appl. No. 14/547,060 including its prosecution history, Nov. 18, 2004, Huang U.S. Appl. No. 14/187,046 Including its prosecution history, filed Feb. 21, 2014, To et al.

U.S. Appl. No. 14/205,024 Including its prosecution history, filed Mar. 11, 2014, Huang et al.

U.S. Appl. No. 14/205,167 Including its prosecution history, filed Mar. 11, 2014, Huang et al.

U.S. Appl. No. 29/427,724 Including its prosecution history, filed Jul. 20, 2012, Brand et al.

U.S. Appl. No. 29/382,515 Including its prosecution history, filed Jan. 4, 2011, Gallouzi et al.

U.S. Appl. No. 29/423,032 Including its prosecution history, filed May 25, 2012, Hasbrook et al.

U.S. Appl. No. 29/406,346 Including its prosecution history, filed Nov. 11, 2011, Brand.

U.S. Appl. No. 29/423,026 Including its prosecution history, filed May 25, 2012, Hasbrook et al.

U.S. Appl. No. 29/433,665 Including its prosecution history, filed Oct. 3, 2012, Namminga et al.

U.S. Appl. No. 29/464,620 Including its prosecution history, filed Aug. 19, 2013, Tsai.

U.S. Appl. No. 29/438,697 Including its prosecution history, filed Nov. 30, 2012, Namminga et al.

U.S. Appl. No. 29/451,703 Including its prosecution history, filed Apr. 6, 2013, Tsai et al.

U.S. Appl. No. 29/435,908 Including its prosecution history, filed Oct. 3, 2012, To et al.

U.S. Appl. No. 29/435,907 Including its prosecution history, filed Oct. 30, 2012, To et al.

U.S. Appl. No. 29/438,877 Including its prosecution history, filed Dec. 4, 2012, To et al.

U.S. Appl. No. 29/440,062 Including its prosecution history, filed Dec. 18, 2012, To et al.

U.S. Appl. No. 29/478,391 Including its prosecution history, filed Jan. 3, 2014, Namminga et al.

U.S. Appl. No. 29/478,390 Including its prosecution history, filed Jan. 3, 2014, Dang et al.

U.S. Appl. No. 29/478,383 Including its prosecution history, filed Jan. 3, 2014, Dang et al.

U.S. Appl. No. 29/478,388 Including its prosecution history, filed Jan. 3, 2014, Kim et al.

U.S. Appl. No. 14/330,613 Including its prosecution history, filed Jul. 14, 2014, Diebel et al.

U.S. Appl. No. 29/499,868 Including its prosecution history, filed Aug. 19, 2014, Mophie, et al.

International Search Report and Written Opinion of the International Searching Authority for PCT/US2011/037244, dated Jul. 19, 2011.

International Preliminary Report on Patentability for PCT/US2011/037244, dated Nov. 29, 2012.

International Search Report and Written Opinion of the International Searching Authority for PCT/US2011/037249, dated Jul. 13, 2011.

International Preliminary Report on Patentability for PCT/US2011/037249, dated Nov. 29, 2012.

International Search Report and Written Opinion of the International Searching Authority for PCT/US2011/037254, dated Jul. 13, 2011.

International Preliminary Report on Patentability for PCT/US2011/037254, dated Nov. 29, 2012.

International Search Report and Written Opinion of the International Searching Authority for PCT/US2011/037257, dated Sep. 22, 2011.

International Preliminary Report on Patentability for PCT/US2011/037257, dated Nov. 29, 2012.

International Search Report and Written Opinion of the International Searching Authority for PCT/US2012/041768, dated Feb. 27, 2013.

International Preliminary Report on Patentability for PCT/US2012/041768, dated Dec. 27, 2013.

International Search Report and Written Opinion of the International Searching Authority for PCT/US2013/057276, dated Dec. 10, 2013.

International Search Report and Written Opinion of the International Searching Authority for PCT/US2014/017781, dated Jun. 8, 2014.

International Search Report and Written Opinion of the International Searching Authority for PCT/US2014/023592, dated Aug. 28, 2014.

Mophie Pulse for iPod Touch 4G, http://www.mophie.com/pulse-iPod-Touch-4th-Gen-vibrating-gaming-case-p/2015_PUL-T4-GRY.htm.

"Sandberg BatteryCase for iPhone 4/4S delivers more band for your buck," dated Mar. 15, 2012, http://www.gizmag.com/sanberg-batterycase-iphone/21839.

Shawn Brown, "Incase Power Slider battery doubles as a case," dated Nov. 19, 2008, http://www.iphonebuzz.com/incase-power-slider-battery-doubles-as-a-case-195224.php.

Nick Guy, "Incipio offGRID Battery Case for iPhone 5/5s," dated Oct. 9, 2013, http://www.ilounge.com/index.php/reviews/entry/incipio-offgrid-battery-case-for-iphone5-5s/.

Jeremy Horwitz, "Mophie Juice Pack Plus for iPhone 5," dated May 21, 2013, http://www.ilounge.com/index.php/reviews/entry/mophie-juice-pack-plus-for-iphone-5/.

Nick Guy, "RND Power Solutions Sync & Charge Dock with Lightning Connector," dated Nov. 18, 2013, http://www.ilounge.com/index.php/reviews/entry/tylt-energi-sl.

Jeremy Horwitz, "Kensington Mini Battery Pack and Charger for iPhone and iPod," dated May 16, 2008, http://www.ilounge.com/index.php/reviews/entry/kensington-mini-battery-pack-and-charger-for-iphone-and-ipod/.

Kensington Mini Battery Pack and Charger for iPhone and iPod, dated Sep. 30, 2008, 1 Page.

Sven Rafferty, "Mybat External Battery for iPhone and iPod," dated May 18, 2008, http://svenontech.com/reviews/?p=74.

Dave Rees, "Richard Solo Backup Battery for iPhone / iPod Review," dated Jun. 16, 2008, http://the-gadgeteer.com/2008/06/16/richard_solo_backup_battery_for_iphone_ipod/.

(56) References Cited

OTHER PUBLICATIONS

Devin Coldewey, "Combination iPhone battery pack and flash from FastMac," dated Nov. 4, 2008, http://crunchgear.com/2008/11/04/combination-iphone-battery-pack-and-flash-from-fastmac/.
"Cheap DIY iPhone External Battery," dated Jul. 22, 2008, http://fastdad.wordpress.com/2008/07/22/cheap-diy-iphone-external-battery/.
Jeremy Horwitz, "iLuv i603 / i604 Rechargeable Lithium Polymer Batteries with Silicone Skin," dated Jun. 27, 2006, http://www.ilounge.com/index.php/reviews/entry/iluv-i603-rechargeable-lithium-polymer-battery-with-silicone-skin/.
Julie Strietelmeier, "Seidio INNODock Desktop Cradle for Treo 650," dated Jul. 28, 2005, http://the-gadgeteer.com/2005/07/28/seidio_innodock_desktop_cradle_for_treo_650/.
Brian Nyhuis, "Mophie Juice Pack Battery Case for Samsung Galaxy S III Review," dated Nov. 28, 2012, http://www.legitreviews.com/mophie-juice-pack-battery-case-for-samsung-galaxy-s-iii-review_2084.
"PowerSkin Samsung Galaxy S3 Case with Backup Battery," dated Aug. 19, 2012 , http://gadgetsin.com/powerskin-samsung-galaxy-s3-case-with-backup-battery.htm.
"iPhone 4 Case with Battery Pack," dated Sep. 28, 2010, http://gadgetsin.com/iphone-4-case-with-battery-pack.htm.
Jonathan Pena, "iPhone 5 Cases, Round 3," dated Sep. 16, 2012, http://www.technologytell.com/apple/103833/iphone-5-cases-round-3/.
Jeremy Horwitz, "Mophie Juice Pack for iPhone," dated Dec. 7, 2007, http://www.ilounge.com/index.php/reviews/entry/mophie-juice-pack-for-iphone/.
Dr. Macenstein, "Review: Mophie Juice Pack for iPhone," dated Apr. 27, 2008, http://macenstein.com/default/archives/1314.
Wayne Schulz, "iPhone Extended Battery Review—Mophie Juice Pack," dated Jun. 17, 2008, http://www.geardiary.com/2008/06/17/iphone-extended-battery-review-mophie-juice-pack/.
Mophie Juice Pack iPhone 1G Product—Figures 1-7—Retrieved from http://www.mophie.com/products/juice-pack on Apr. 10, 2009.
Mophie Juice Pack iPhone 1G Product—Figure 8—Retrieved from http://www.mophie.com/pages/information/ on Apr. 10, 2009.
Mophie Juice Pack iPhone 1G Product—Figures 9-14—Retrieved from http://www.mophie.com/blogs/Juice_Pack_FAQ on Apr. 10, 2009.
Mophie Juice Pack iPhone 1G Product—Figures 15-16—Retrieved from http://mophie.com/blogs/Juice_Pack_FAQ on Apr. 20, 2009. Figure 16 is dated May 1, 2008.
Tomas Ratas, "Mophie Juice Pack—iPhone 3G," dated Dec. 9, 2008, http://www.testfreaks.com/blog/review/mophie-juice-pack-iphone-3g/.
Dr. Macenstein, "Review: Mophie Juice Pack 3G for iPhone," dated Nov. 27, 2008, http://macenstein.com/default/archives/1820.
Ewdison Then, "Mophie Juice Pack iPhone 3G Review," dated Nov. 12, 2008, http://www.slashgear.com/mophie-juice-pack-iphone-3g-review-1222446/.
Mophie Juice Pack iPhone 3G Product—Figures 1-8—Retrieved from http://www.mophie.com/products/juice-pack-iphone-3g on Apr. 10, 2009.
Mophie Juice Pack iPhone 3G Product—Figures 9-10—Retrieved from http://www.mophie.com/pages/iphone-3g-details on Apr. 10, 2009.
Mophie Juice Pack iPhone 3G Product—Figures 11-14—Retrieved from http://mophie.com/blogs/Juice_Pack_3G_FAQ on Apr. 10, 2009.
Mophie Juice Pack iPhone 3G Product—Figures 15-16—Retrieved from http://mophie.com/blogs/press on Apr. 20, 2009. Figure 15 is dated Aug. 4, 2008, and Figure 16 is dated Nov. 10, 2008.
Mophie Juice Pack iPhone 3G User Manual—Retrieved from http://static3.shopify.com/s/files/1/0008/4942/assets/mophie_juice_pack_3G_manual_rl.pdf on Apr. 10, 2009.
Panasonic Lithium Ion Batteries Technical Handbook, dated 2007.
Chris Foresman, "Several Backup Batteries Can Extend Your Daily iPhone 3G Use," dated Jul. 18, 2008, http://arstechnica.com/apple/2008/07/several-backup-batteries-can-extend-your-daily-iphone-3g-use/.
Using Your Treo 650 Smartphone by palmOne, dated 2005.
Lisa Gade, "Palm Treo 750," dated Jan. 17, 2007, http://www.mobiletechreview.com/phones/Treo-750.htm.
Incase Power Slider 3G for iPhone 3G Product Reference, alleged by Incase to be available on Nov. 28, 2008.
iPhone User's Guide, 2007.
"Power Slider," Web Archive Date Dec. 4, 2008, https://web.archive.org/web/20081204105303/http://goincase.com/products/detail/power-slider-ec20003/.
Azadeh Ensha, "A Case for Filling the iPhone 3G's Power Vacuum," Dated Nov. 27, 2008.
Joseph Flatley, "Incase Power Slider for iPhone 3G Doubles the Juice, Lets You Sync," dated Nov. 17, 2008.
Darren Quick, "Mophie Juice Pack for iPhone 3G now shipping," dated Nov. 10, 2008, http://www.gizmag.com/mophie-juice-pack-iphone-3g/10342/.
Otterbox Catalog, 2006.
Jeremy Horowitz, "PhoneSuit MiLi Power Pack for iPhone," Jan. 29, 2009, http://www.ilounge.com/index.php/reviews/entry/phonesuit-mili-power-pack-for-iphone/.
Jeremy Horowitz, "FastMac TruePower iV Universal Battery Charger," Dec. 11, 2008, http://www.ilounge.com/index.php/reviews/entry/fastmac-truepower-iv-universal-battery-charger/.
Jeremy Horowitz, "Konnet PowerKZ Extended Power for iPhone," Apr. 2, 2009, http://www.ilounge.com/index.php/reviews/entry/konnet-powerkz-extended-power-for-iphone/.
"Test: Batterie iPhone SKPAD" with Machine English Translation, Feb. 2, 2009, http://iphonesofa.com/2009/02/02/test-batterie-iphone-skpad.
Kanamori et al., "USB battery-charger designs meet new industry standards," EDN pp. 63-70, dated Feb. 21, 2008.
AVR458: Charging Lithium-Ion Batteries with ATAVRBC100, which appear to include a date of Aug. 2008.
Battery Charging Specification, dated Apr. 15, 2009.
BCM2033 Product Brief, 2 pages, dated Nov. 1, 2002.
"USB battery charger detector intelligently powers mobiles," Dec. 17, 2007, http://www.eetasia.com/ART_8800493819_765245_NP_10b171b6.HTMce#.
Webpage Archive, Mophie.com, Nov. 25, 2007.
Ben Kaufman, "Behind the Invention: The mophie Juice Pack," dated Dec. 31, 2013, https://medium.com/@benkaufma n/behind-the-invention-the-mophie-juice-pack-a0620f74efcf.
Mophie Relo Recharge, dated Feb. 7, 2006, http://songsling.com/recharge.html.
*Case-Ari, LLC* v. *mStation, Inc.*, Case No. 1:2010-CV-01874 in the United States District Court for the Northern District of Georgia, filed Jun. 17, 2010 (Docket).
*Daniel Huang* v. *GC Technology, LLC*, Case No. CV10-4705 CAS (VBKx) in the United States District Court for the Central District of California, filed Jun. 24, 2010 (Docket).
*Hali-Power, Inc.* v. *mStation Corp.*, Case No. 1:2010-CV-00773 in the United States District Court for the Northern District of New York, filed Jun. 30, 2010 (Docket).
*Mophie, Inc.* v. *Loza & Loza, LLP*, Case No. SACV11-00539 DOC (MLGx) in the United States District Court for the Central District of California, filed Apr. 7, 2011 (Docket).
Mophie's Complaint, filed Apr. 7, 2011 in *Mophie, Inc.* v. *Loza & Loza, LLP*, Case No. SACV11-00539 DOC (MLGx) in the United States District Court for the Central District of California.
*Mophie, Inc.* v. *Foreign Trade Corporation*, Case No. 8:12-CV-00292-JST-RNB in the United States District Court for the Central District of California, filed Feb. 24, 2012 (Docket).
*Mophie, Inc.* v. *Kdlinks Inc.*, Case No. 2:2012-CV-02639 in the United States District Court for the Central District of California, filed Mar. 27, 2012 (Docket).
*Otter Products, LLC* v. *Mophie, LLC*, Case No. 1:2012-CV-01969 in the United States District Court for the District of Colorado, filed Jul. 27, 2012 (Docket).

(56) References Cited

OTHER PUBLICATIONS

Mophie's Answer, filed Oct. 15, 2012 in *Otter Products, LLC* v. *Mophie, LLC*, Case No. 1:2012-CV-01969 in the United States District Court for the District of Colorado.
Otter's Motion for Summary Judgment of Infringement and Declaration in Support Thereof, filed May 13, 2013 in *Otter Products, LLC* v. *Mophie, LLC*, Case No. 1:2012-CV-01969 in the United States District Court for the District of Colorado.
Mophie's Opposition to Motion for Summary Judgment of Infringement, filed Jun. 6, 2013 in *Otter Products, LLC* v. *Mophie, LLC*, Case No. 1:2012-CV-01969 in the United States District Court for the District of Colorado.
Mophie's Claim Construction Brief, filed Jun. 14, 2013 in *Otter Products, LLC* v. *Mophie, LLC*, Case No. 1:2012-CV-01969 in the United States District Court for the District of Colorado.
Otter's Claim Construction Brief, filed Jun. 14, 2013 in *Otter Products, LLC* v. *Mophie, LLC*, Case No. 1:2012-CV-01969 in the United States District Court for the District of Colorado.
Mophie's Brief in Response to Otter's Claim Construction Brief, filed Jun. 24, 2013 in *Otter Products, LLC* v. *Mophie, LLC*, Case No. 1:2012-CV-01969 in the United States District Court for the District of Colorado.
Otter's Rebuttal Brief for Construction of Claim Terms and Declaration, filed Jun. 24, 2013 in *Otter Products, LLC* v. *Mophie, LLC*, Case No. 1:2012-CV-01969 in the United States District Court for the District of Colorado.
Otter's Reply in Support of Motion for Summary Judgment of Infringement, filed Jun. 24, 2013 in *Otter Products, LLC* v. *Mophie, LLC*, Case No. 1:2012-CV-01969 in the United States District Court for the District of Colorado.
Joint Claim Construction Statement, filed Jun. 26, 2013 in *Otter Products, LLC* v. *Mophie, LLC*, Case No. 1:2012-CV-01969 in the United States District Court for the District of Colorado.
*Incase Designs, Inc.* v. *Mophie, Inc.*, Case No. 3:2013-CV-00602 in the United States District Court for the Northern District of California, filed Feb. 12, 2013 (Docket).
Mophie's Amended Answer and Counterclaims, filed May 8, 2013 in *Incase Designs, Inc.* v. *Mophie, Inc.*, Case No. 3:2013-CV-00602 in the United States District Court for the Northern District of California.
Mophie's Opposition to Motion to Strike Amended Affirmative Defenses, Filed Jun. 12, 2013 in*Incase Designs, Inc.* v. *Mophie, Inc.*, Case No. 3:2013-CV-00602 in the United States District Court for the Northern District of California.
Mophie's Reply in Support of Motion to Stay and Supporting Declaration, filed Sep. 3, 2103 in *Incase Designs, Inc.* v. *Mophie, Inc.*, Case No. 3:2013-CV-00602 in the United States District Court for the Northern District of California.
*Incase Designs, Inc.* v. *Mophie, Inc.*, Case No. 3:2013-CV-03356 in the United States District Court for the Northern District of California, filed Jul. 18, 2013 (Docket).
*Incase Designs, Corp.* v. *Mophie, Inc.*, Case No. 3:2013-CV-04314 in the United States District Court for the Northern District of California, filed Sep. 18, 2013 (Docket).
Mophie Motion 1—To Be Accorded Benefit, filed Nov. 20, 2013 in Patent Interference No. 105,946(RES).
Declaration of John Feland, Ph.D, In Support of Mophie Motion 1 To Be Accorded Benefit, dated Nov. 20, 2013, in Patent Interference No. 105,946(RES).
Mophie Motion 2—For Judgment that Incase's Involved Claims Are Unpatentable, filed Nov. 20, 2013 in Patent Interference No. 105,946(RES).
Declaration of John Feland, Ph.D, In Support of Mophie Motion 2 for Judgement That Incase's Involved Claims Are Unpatentable, dated Nov. 20, 2013, in Patent Interference No. 105,946(RES).
Incase Motion 1—Motion for Benefit, filed Nov. 20, 2013 in Patent Interference No. 105,946(RES).
Incase Motion 2—Motion to Undesignate Claims, filed Nov. 20, 2013 in Patent Interference No. 105,946(RES).
Incase Motion 3—Motion for Judgment Based on Lack of Written Description, filed Nov. 20, 2013 in Patent Interference No. 105,946(RES).
Incase Motion 4—Motion for Unpatentability of Mophie Claims, filed Nov. 20, 2013 in Patent Interference No. 105,946(RES).
Declaration of Andrew Wolfe, filed Nov. 20, 2013 in Patent Interference No. 105,946(RES).
Declaration of Thomas Overthun, filed Nov. 20, 2013 in Patent Interference No. 105,946(RES).
Declaration of Gabriel Dan, filed Nov. 20, 2013 in Patent Interference No. 105,946(RES).
Mophie's Third Amended Complaint, filed Jun. 27, 2014, in *Mophie, Inc.* v. *Source Vista*, Case No. 8:13-CV-01321 in the United States District Court for the Central District of California.
LivingSocial's Answer to Mophie's Fifth Amended Complaint and Counterclaims, filed Sep. 24, 2014, in *Mophie, Inc.* v. *Source Vista*, Case No. 8:13-CV-01321 in the United States District Court for the Central District of California.
Shah's Answer, Affirmative Defenses, and Counterclaims to Plaintiff's Fifth Amended Complaint, filed Sep. 24, 2014, in *Mophie, Inc.* v. *Source Vista*, Case No. 8:13-CV-01321 in the United States District Court for the Central District of California.
Expert Report of Dr. David Munson, dated Aug. 28, 2014, in *Mophie, Inc.* v. *Source Vista*, Case No. 8:13-CV-01321 in the United States District Court for the Central District of California.
Expert Report of John Feland, Ph.D, dated Aug. 28, 2014, in *Mophie, Inc.* v. *Source Vista*, Case No. 8:13-CV-01321 in the United States District Court for the Central District of California.
Rebutal Expert Report of John Feland, Ph.D, dated Sep. 25, 2014, in *Mophie, Inc.* v. *Source Vista*, Case No. 8:13-CV-01321 in the United States District Court for the Central District of California.
Rebutal Expert Report of Dr. David Munson, dated Sep. 25, 2014, in *Mophie, Inc.* v. *Source Vista*, Case No. 8:13-CV-01321 in the United States District Court for the Central District of California.
Mophie's Second Amended Response to LivingSocial's Interrogatory No. 1[21], dated Aug. 28, 2014, in *Mophie, Inc.* v. *Source Vista*, Case No. 8:13-CV-01321 in the United States District Court for the Central District of California.
Mophie's Second Amended Response to Serve Global's Interrogatory No. 2, dated Aug. 28, 2014, in *Mophie, Inc.* v. *Source Vista*, Case No. 8:13-CV-01321 in the United States District Court for the Central District of California.
Defendant's Memorandum in Support of Motion for Partial Summary Judgement, dated Sep. 23, 2014, in *Mophie, Inc.* v. *Source Vista*, Case No. 8:13-CV-01321 in the United States District Court for the Central District of California.
Declaration of David Munson in Support of Defendant's Motion for Partial Summary Judgment, dated Sep. 22, 2014, in *Mophie, Inc.* v. *Source Vista*, Case No. 8:13-CV-01321 in the United States District Court for the Central District of California.
John Feland, Ph.D. Deposition Transcript, dated Sep. 30, 2014, in *Mophie, Inc.* v. *Source Vista*, Case No. 8:13-CV-01321 in the United States District Court for the Central District of California.
Matthew Brand Deposition Transcript, dated Jul. 23, 2014, in *Mophie, Inc.* v. *Source Vista*, Case No. 8:13-CV-01321 in the United States District Court for the Central District of California.
Dharmesh Shah Deposition Transcript, dated Jul. 11, 2014, in *Mophie, Inc.* v. *Source Vista*, Case No. 8:13-CV-01321 in the United States District Court for the Central District of California.
Defendants' Statement of Uncontroverted Material Fact and Contentions of Law, filed Sep. 22, 2014 in *Mophie, Inc.* v. *Source Vista*, Case No. 8:13-CV-01321 in the United States District Court for the Central District of California.
Memorandum of Points and Authorities in Support of Mophie's Motion for Summary Judgment, filed Sep. 22, 2014, in *Mophie, Inc.* v. *Source Vista*, Case No. 8:13-CV-01321 in the United States District Court for the Central District of California.
Statement of Uncontroverted Facts and Conclusions of Law in Support of Mophie's Motion for Summary Judgment, filed Sep. 22, 2014, in *Mophie, Inc.* v. *Source Vista*, Case No. 8:13-CV-01321 in the United States District Court for the Central District of California.

(56) References Cited

OTHER PUBLICATIONS

Mophie's Opposition to Shah and Serve Global's Motion for Partial Summary Judgment, dated Oct. 3, 2014, in *Mophie, Inc.* v. *Source Vista*, Case No. 8:13-CV-01321 in the United States District Court for the Central District of California.
Statement of Genuine Disputes of Material Fact in Opposition to Shah and Serve Global's Motion for Partial Summary Judgment, filed Oct. 3, 2014, in *Mophie, Inc.* v. *Source Vista*, Case No. 8:13-CV-01321 in the United States District Court for the Central District of California.
Opposition of LivingSocial to Mophie's Motion for Summary Judgment, dated Oct. 3, 2014, in *Mophie, Inc.* v. *Source Vista*, Case No. 8:13-CV-01321 in the United States District Court for the Central District of California.
Defendants' Opposition to Plaintiffs Motion for Summary Judgment, filed Oct. 3, 2014, in *Mophie, Inc.* v. *Source Vista*, Case No. 8:13-CV-01321 in the United States District Court for the Central District of California.
Defendants' Response to Plaintiffs Statement of Uncontroverted Material Fact and Contentions of Law, filed Oct. 3, 2014, in *Mophie, Inc.* v. *Source Vista*, Case No. 8:13-CV-01321 in the United States District Court for the Central District of California.
David Munson Deposition Transcript, dated Sep. 29, 2014, in *Mophie, Inc.* v. *Source Vista*, Case No. 8:13-CV-01321 in the United States District Court for the Central District of California.
Mophie's First Amended Complaint, filed Jun. 25, 2014, in *Mophie, Inc.* v. *UNU Electronics Inc.*, Case No. 8:13-CV-01705 in the United States District Court for the Central District of California.
UNU's Answer and Counterclaims, filed Jul. 10, 2014, in *Mophie, Inc.* v. *UNU Electronics Inc.*, Case No. 8:13-CV-01705 in the United States District Court for the Central District of California.
Mophie's Responses to Defendant's Third Set of Interrogatories (No. 12), dated Aug. 21, 2014, in *Mophie, Inc.* v. *UNU Electronics Inc.*, Case No. 8:13-CV-01705 in the United States District Court for the Central District of California.
Mophie's Responses to Defendant's First set of Requests for Admissions (Nos. 1-46), dated Aug. 19, 2014, in *Mophie, Inc.* v. *UNU Electronics Inc.*, Case No. 8:13-CV-01705 in the United States District Court for the Central District of California.
Mophie's Responses to Defendant's Second set of Requests for Admissions (Nos. 47-109), dated Aug. 19, 2014, in *Mophie, Inc.* v. *UNU Electronics Inc.*, Case No. 8:13-CV-01705 in the United States District Court for the Central District of California.
Request for Ex Parte Reexamination of U.S. Pat. No. 8,367,235, filed Aug. 14, 2014.
Corrected Request for Ex Parte Reexamination of U.S. Pat. No. 8,367,235, filed Sep. 18, 2014.
Declaration of John Feland, Ph.D. In Support of Mophie's Opposition to Defendants Motion for Partial Summary Judgment, filed Oct. 3, 2014, in *Mophie, Inc.* v. *Source Vista*, Case No. 8:13-CV-01321 in the United States District Court for the Central District of California.
LivingSocial's Reply in Support of Motion for Summary Judgment, Filed Oct. 10, 2014, in *Mophie, Inc.* v. *Source Vista*, Case No. 8:13-CV-01321 in the United States District Court for the Central District of California.
Defendants' Reply in Support of Motion for Partial Summary Judgment, Filed Oct. 10, 2014, in *Mophie, Inc.* v. *Source Vista*, Case No. 8:13-CV-01321 in the United States District Court for the Central District of California.
Reply in Support of Mophie's Motion for Summary Judgment, Filed Oct. 10, 2014, in *Mophie, Inc.* v. *Source Vista*, Case No. 8:13-CV-01321 in the United States District Court for the Central District of California.
Mophie's Reply to Counterclaims of LivingSocial, filed Oct. 14, 2014, in *Mophie, Inc.* v. *Source Vista*, Case No. 8:13-CV-01321 in the United States District Court for the Central District of California.
Mophie's Reply to Counterclaims of Shah, filed Oct. 14, 2014, in *Mophie, Inc.* v. *Source Vista*, Case No. 8:13-CV-01321 in the United States District Court for the Central District of California.
Defendant's Response to Mophie's Fourth Set of Interrogatories, dated Sep. 23, 2014, in *Mophie, Inc.* v. *UNU Electronics Inc.*, Case No. 8:13-CV-01705 in the United States District Court for the Central District of California.
Plaintiff Mophie's Preliminary Claim Constructions and Identification of Extrinsic Evidence, dated Oct. 14, 2014, in *Mophie, Inc.* v. *UNU Electronics Inc.*, Case No. 8:13-CV-01705 in the United States District Court for the Central District of California.
Defendant's Preliminary Claim Constructions and Extrinsic Evicence, dated Oct. 14, 2014, in *Mophie, Inc.* v. *UNU Electronics Inc.*, Case No. 8:13-CV-01705 in the United States District Court for the Central District of California.
Plaintiff Mophie's Opening Brief on Claim Construction, filed Oct. 29, 2014, in *Mophie, Inc.* v. *UNU Electronics Inc.*, Case No. 8:13-CV-01705 in the United States District Court for the Central District of California.
Declaration of John Feland, Ph.D. In Support of Plaintiff's Preliminary Claim Constructions, filed Oct. 29, 2014, in *Mophie, Inc.* v. *UNU Electronics Inc.*, Case No. 8:13-CV-01705 in the United States District Court for the Central District of California.
Supplemental Declaration of John Feland, Ph.D. In Support of Plaintiff's Claim Constructions, filed Oct. 29, 2014, in *Mophie, Inc.* v. *UNU Electronics Inc.*, Case No. 8:13-CV-01705 in the United States District Court for the Central District of California.
Declaration of Sheila N. Swaroop in Support of Mophie's Opening Claim Construction Brief, filed Oct. 29, 2014, in *Mophie, Inc.* v. *UNU Electronics Inc.*, Case No. 8:13-CV-01705 in the United States District Court for the Central District of California.
Transcript of Deposition of John Feland, dated Oct. 21, 2014, in *Mophie, Inc.* v. *UNU Electronics Inc.*, Case No. 8:13-CV-01705 in the United States District Court for the Central District of California.
Defendant's Opening Claim Construction Brief, dated Oct. 29, 2014, in *Mophie, Inc.* v. *UNU Electronics Inc.*, Case No. 8:13-CV-01705 in the United States District Court for the Central District of California.
Order Granting Request for Ex Parte Reexamination of U.S. Pat. No. 8,367,235, in Reexamination Control No. 90/013,319, dated Oct. 24, 2014.
Order Re LivingSocial's Motion for Summary Judgment, Mophie's Motion for Summary Judgment, Source Vista and Shah's Motion for Partial Summary Judgment, and Mophie's Motion to Bifurcate, dated Nov. 12, 2014, in *Mophie, Inc.* v. *Source Vista*, Case No. 8:13-CV-01321 in the United States District Court for the Central District of California.
Mophie's Memorandum in Support of its Motion for Reconsideration, filed Nov. 19, 2014, in *Mophie, Inc.* v. *Source Vista*, Case No. 8:13-CV-01321 in the United States District Court for the Central District of California.
Declaration of Sheila N. Swaroop in Support of Mophie's Motion for Reconsideration, filed Nov. 19, 2014, in *Mophie, Inc.* v. *Source Vista*, Case No. 8:13-CV-01321 in the United States District Court for the Central District of California.
Order Denying Plantiff's Motion for Reconsideration, dated Nov. 21, 2014, in *Mophie, Inc.* v. *Source Vista*, Case No. 8:13-CV-01321 in the United States District Court for the Central District of California.
U.S. Appl. No. 14/679,899 Including its prosecution history, filed Apr. 6, 2015, Huang.
U.S. Appl. No. 14/675,067 Including its prosecution history, filed Mar. 31, 2015, To et al.
U.S. Appl. No. 29/510,154 Including its prosecution history, filed Nov. 25, 2014, Mophie, Inc.
U.S. Appl. No. 29/510,153 Including its prosecution history, filed Nov. 25, 2014, Mophie, Inc.
U.S. Appl. No. 29/522,987 Including its prosecution history, filed Apr. 6, 2015, Gjøvik et al.
U.S. Appl. No. 29/510,839 Including its prosecution history, filed Dec. 3, 2014, Mophie, Inc.

(56) References Cited

OTHER PUBLICATIONS

U.S. Appl. No. 29/523,211 Including its prosecution history, filed Apr. 7, 2015, To et al.
U.S. Appl. No. 29/523,209 Including its prosecution history, filed Apr. 7, 2015, Mophie, Inc.
U.S. Appl. No. 29/528,266 Including its prosecution history, filed May 27, 2015, Gjøvik et al.
International Preliminary Report on Patentability for PCT/US2013/057276, dated Mar. 3, 2015.
International Search Report and Written Opinion for PCT/US2014/067470, dated Mar. 31, 2015.
Defendants Dharmesh Shah and Serve Global, LLC's Memorandum of Points and Authorities in Support of Defendants's Motion for Attorney's Fees, filed Mar. 21, 2015, in *Mophie, Inc.* v. *Source Vista*, Case No. 8:13-CV-01321 in the United States District Court for the Central District of California.
Memorandum of Points and Authorities in Support of Livingsocial, Inc.'s Motion for Legal Fees and Costs, filed Mar. 20, 2015, in *Mophie, Inc.* v. *Source Vista*, Case No. 8:13-CV-01321 in the United States District Court for the Central District of California.
Plaintiff Mophie, Inc.'s Opposition to Defendants Dharmesh Shah and Serve Global, LLC's Motion for Attorneys' Fees, filed Apr. 3, 2015, in *Mophie, Inc.* v. *Source Vista*, Case No. 8:13-CV-01321 in the United States District Court for the Central District of California.
Plaintiff Mophie, Inc.'s Opposition to Defendant Livingsocial, Inc.'s Motion for Attorneys' Fees, filed Apr. 3, 2015, in *Mophie, Inc.* v. *Source Vista*, Case No. 8:13-CV-01321 in the United States District Court for the Central District of California.
Reply to Plaintiff's Opposition to Defendants Dharmesh Shah and Serve Global, LLC's Motion for Attorney's Fees, filed Apr. 10, 2015, in *Mophie, Inc.* v. *Source Vista*, Case No. 8:13-CV-01321 in the United States District Court for the Central District of California.
Reply in Support of Livingsocial, Inc.'s Motion for Legal Fees and Costs, filed Apr. 10, 2015, in *Mophie, Inc.* v. *Source Vista*, Case No. 8:13-CV-01321 in the United States District Court for the Central District of California.
International Preliminary Report on Patentability for PCT/US2014/017781, dated Aug. 25, 2015.
International Preliminary Report on Patentability for PCT/US2014/023592, dated Sep. 15, 2015.
Daniel Huang Deposition Transcript (Redacted) with Exhibit 121, dated Aug. 21, 2014, in *Mophie, Inc.* v. *Source Vista*, Case No. 8:13-CV-01321 in the United States District Court for the Central District of California.
U.S. Appl. No. 14/800,530 Including its prosecution history, filed Jul. 15, 2015, Huang.
U.S. Appl. No. 29/539,419 Including its prosecution history, filed Sep. 14, 2015, Dang et al.
U.S. Appl. No. 29/534,901 Including its prosecution history, filed Jul. 31, 2015, Dang et al.
Amended Final Judgment and Permanent Injunction, dated Dec. 11, 2015, in *Mophie, Inc.* v. *Source Vista*, Case No. 8:13-CV-01321 in the United States District Court for the Central District of California.
Order Re Motions for Attorneys' Fees, Motion to Amend Permanent Injunction, Motions for Judgment as a Matter of Law, Motion for Relief From Judgment, and Motion for New Trial, dated Dec. 11, 2015, in *Mophie, Inc.* v. *Source Vista*, Case No. 8:13-CV-01321 in the United States District Court for the Central District of California.
Mophie's Complaint, filed Dec. 16, 2015, in *Mophie, Inc.* v. *Cute Mobile Inc.*, Case No. 8:15-cv-02086 in the United States District Court for the Central District of California.
U.S. Appl. No. 15/130,196 including its prosecution history, filed Apr. 15, 2016, Huang.
U.S. Appl. No. 15/223,683 Including its prosecution history, filed Jul. 29, 2016, Huang et al.
U.S. Appl. No. 15/223,735 Including its prosecution history, filed Jul. 29, 2016, Diebel et al.
International Preliminary Report of Patentability for PCT/US2014/067470, dated Jun. 9, 2016.
International Search Report and Written Opinion for PCT/US2015/065800, dated Apr. 21, 2016.
Amazon.com, "Galaxy S6 Battery Case, i-Blason External Protective Battery Case/Cover for Samsung Galaxy S6 2015 Release." Customer Review published Mar. 29, 2015. Retrieved from internet at <http://www.amazon.com/Case-i-Blason-External-Protective-Versions/dp/B00SNS4LME>, Apr. 28, 2016. 7 pages.
Mophie's First Amended Complaint, filed May 25, 2016 in *Mophie, Inc.* v. *Cute Mobile Inc.*, Case No. 8:15-cv-02086 in the United States District Court for the Central District of California.

* cited by examiner

BATTERY PACK AND HOLSTER FOR MOBILE DEVICES

CROSS-REFERENCE TO RELATED APPLICATIONS

This application is a continuation of U.S. patent application Ser. No. 12/938,351, titled BATTERY PACK, HOLSTER, AND EXTENDIBLE PROCESSING AND INTERFACE PLATFORM FOR MOBILE DEVICES, filed on Nov. 2, 2010, which is a divisional of U.S. patent application Ser. No. 12/357,262, titled BATTERY PACK, HOLSTER, AND EXTENDIBLE PROCESSING AND INTERFACE PLATFORM FOR MOBILE DEVICES, filed on Jan. 21, 2009, which claims the benefit under 35 U.S.C. §119(e) to U.S. Provisional Patent Application No. 61/021,897, titled BATTERY PACK AND HOLSTER FOR MOBILE DEVICES, and filed Jan. 18, 2008, the disclosures of which are hereby expressly incorporated by reference for all purposes.

FIELD

One embodiment relates to battery packs and/or holsters and, more particular, to an external battery pack and/or holster for mobile electronic devices.

BACKGROUND

Many mobile devices (e.g., mobile phones, digital assistants, mobile communication devices, handheld computing devices, personal music/video/content players and storage devices) are often powered by battery power sources. Such battery power sources are often housed within the mobile device and may be changed and/or recharged as needed. However, as more powerful mobile devices are designed, these tend to consume power more quickly, thereby shortening the time between charges. This tends to limit the usefulness of the mobile device since the user must find a power source to recharge the battery source and wait until it is recharged.

Additionally, after a certain number of recharges, a battery source may need to be replaced as it may no longer hold a charge. Oftentimes, it is not easy to replace a battery source as the mobile device may need to be disassembled or opened to reach the battery source.

Therefore, a way is needed to extend the time between charges of mobile devices and/or continue to power the mobile device even after an internal power source has been depleted.

SUMMARY

One embodiment relates to battery packs and/or holsters and, more particular, to an external battery pack and/or holster for mobile electronic devices.

DETAILED DESCRIPTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Various embodiments provide battery packs shaped to conform to the external shape of a mobile device, thereby providing a permanent replacement power source without significantly affecting the size and usability of the mobile device.

First Embodiment

Figure 1:
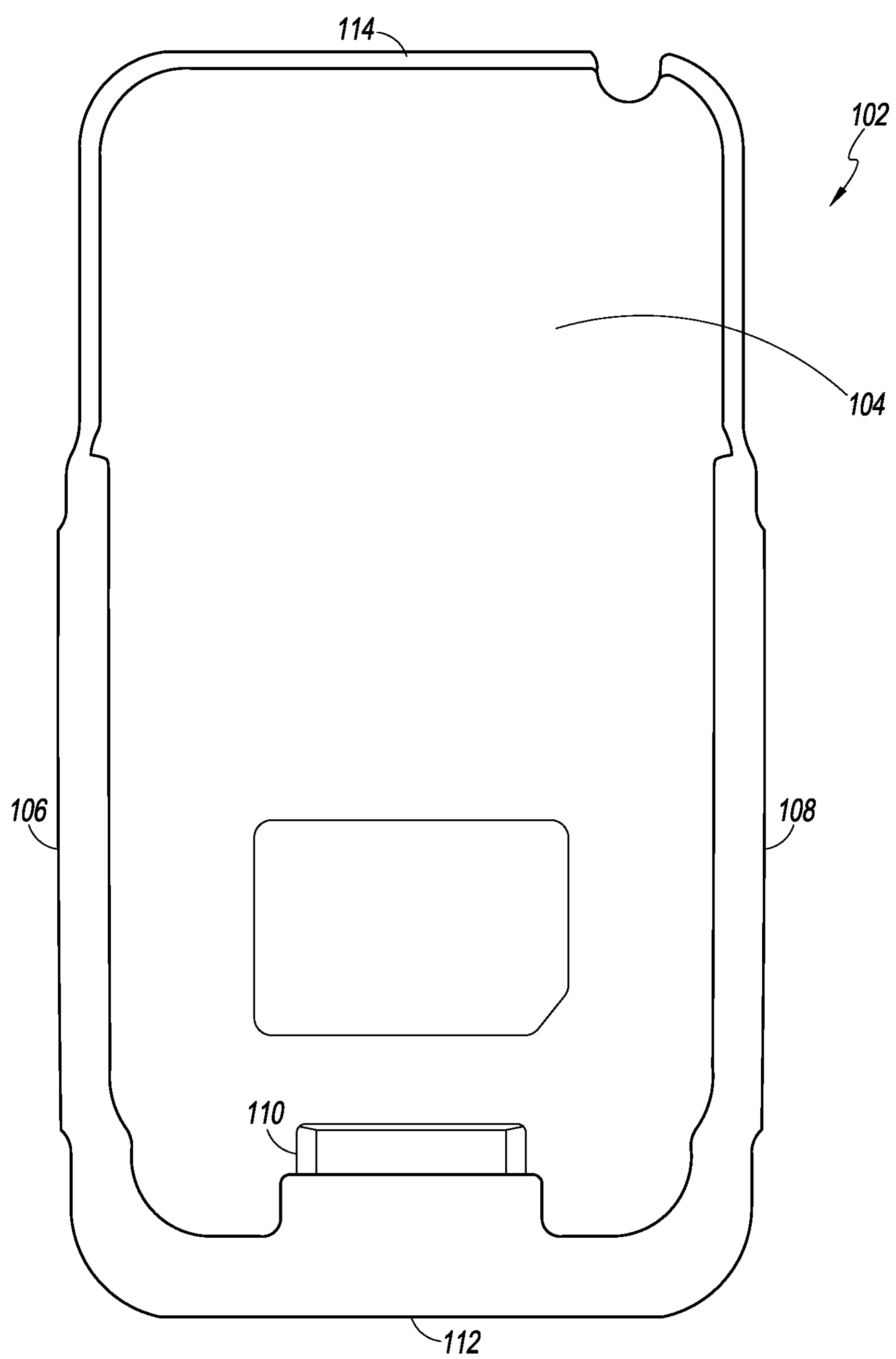
FIG. 1 illustrates a front view of one example of a battery pack for a mobile device.

FIGS. 1-5 illustrate one example of a battery pack for a mobile device. FIG. 1 illustrates a front view of the battery pack 102 includes a back plane 104, first and second sides

106 and 108, and a bottom side 112. The back plane 104, first and second sides 106 and bottom side 112 may be shaped to form a pocket into which a mobile device to be powered can slide. A top portion 114 of the battery pack 102 may remain open to allow insertion and removal of the mobile device. A device interface 110 may be positioned along the bottom side 112 to couple with the mobile device. The device interface 110 may serve for the battery pack 102 to provide power to the mobile device. The battery pack may be detached from the mobile device to be recharged. In some examples, a user may have two battery packs so that when one is being charged, the other can be powering the mobile device.

Figure 2:
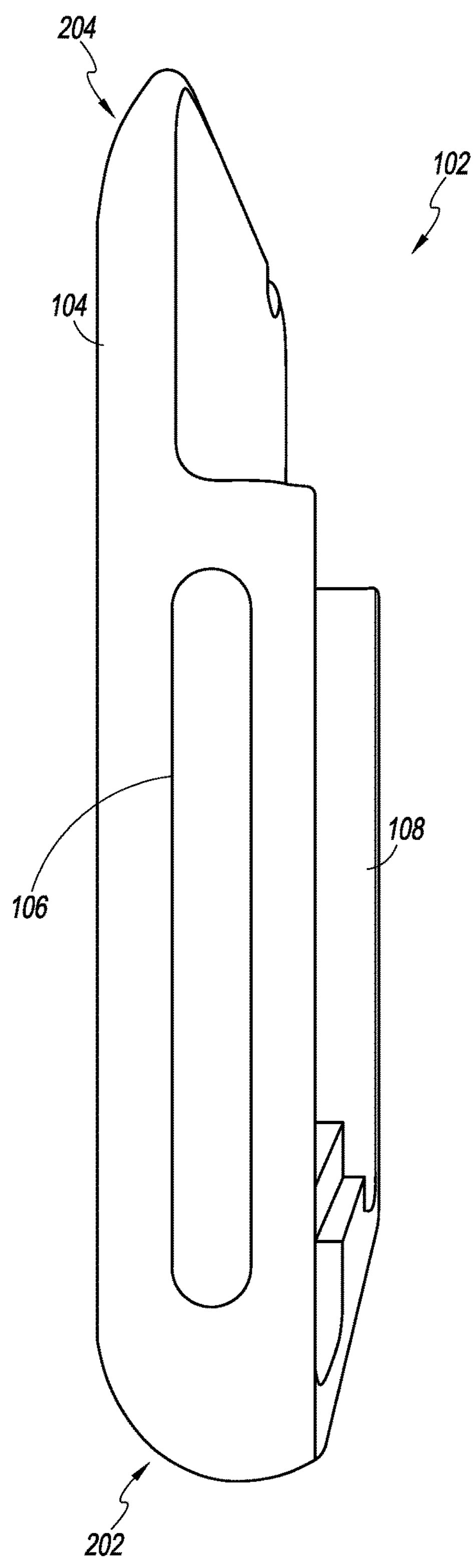
FIG. 2 illustrates a side view of the example battery pack of FIG. 1.

FIG. 2 illustrates a side view of the battery pack 102. The first and second sides 106 and 108 may extend the whole length or a partial length of the battery pack 102. The sides and ends 202 and 204 of the battery pack 102 may be rounded to provide an ergonomic shape. Additionally, internal rechargeable battery cells may be housed within the thickness of the back plane 104. The internal rechargeable battery cells may be coupled to the device interface 110 to provide power to the mobile device.

Figure 3:
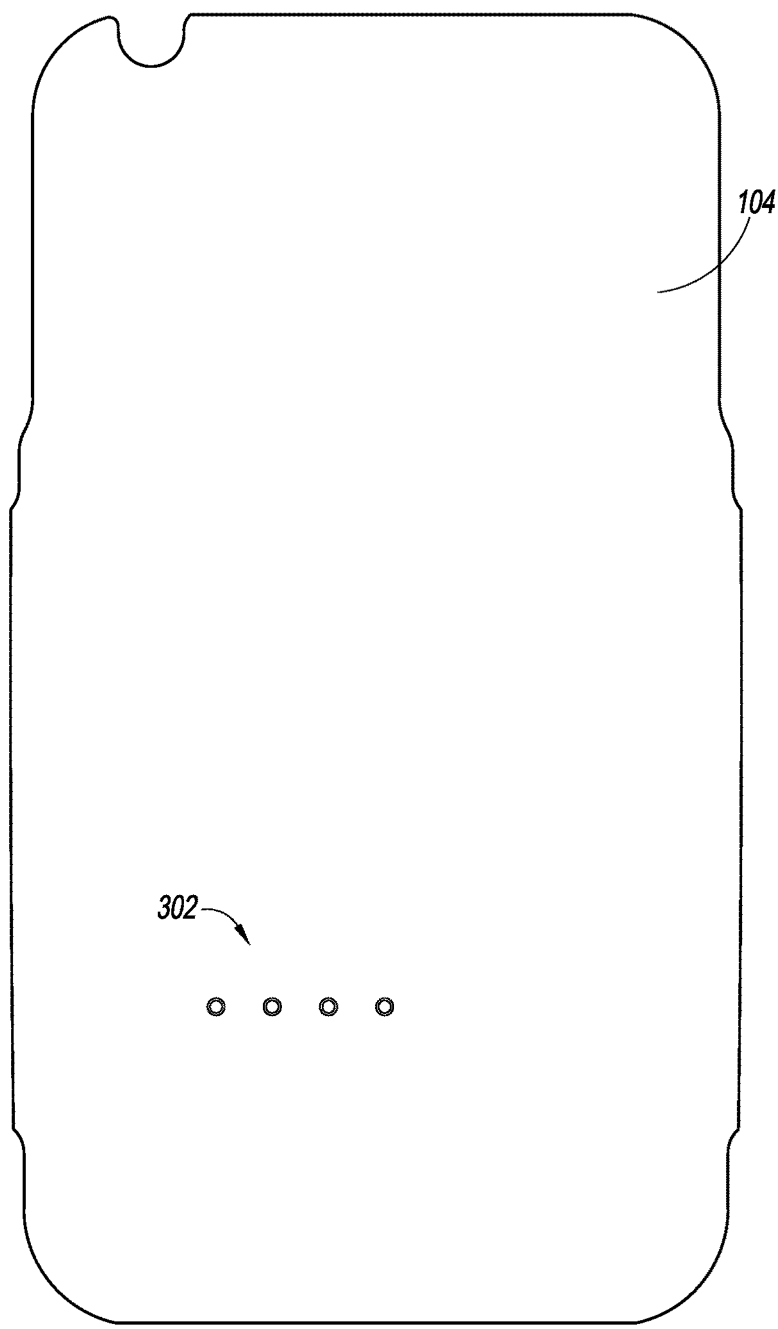
FIG. 3 illustrates a back view of the example battery pack of FIG. 1.

FIG. 3 illustrates a back view of the battery pack 102. The size or dimensions of the back plane 104 may be approximately that of the mobile device to which it is intended to provide power. Additionally, a plurality of LEDs 302 may be mounted on the back surface to indicate the charge status of the internal battery cells of the battery pack 102.

Figure 4:
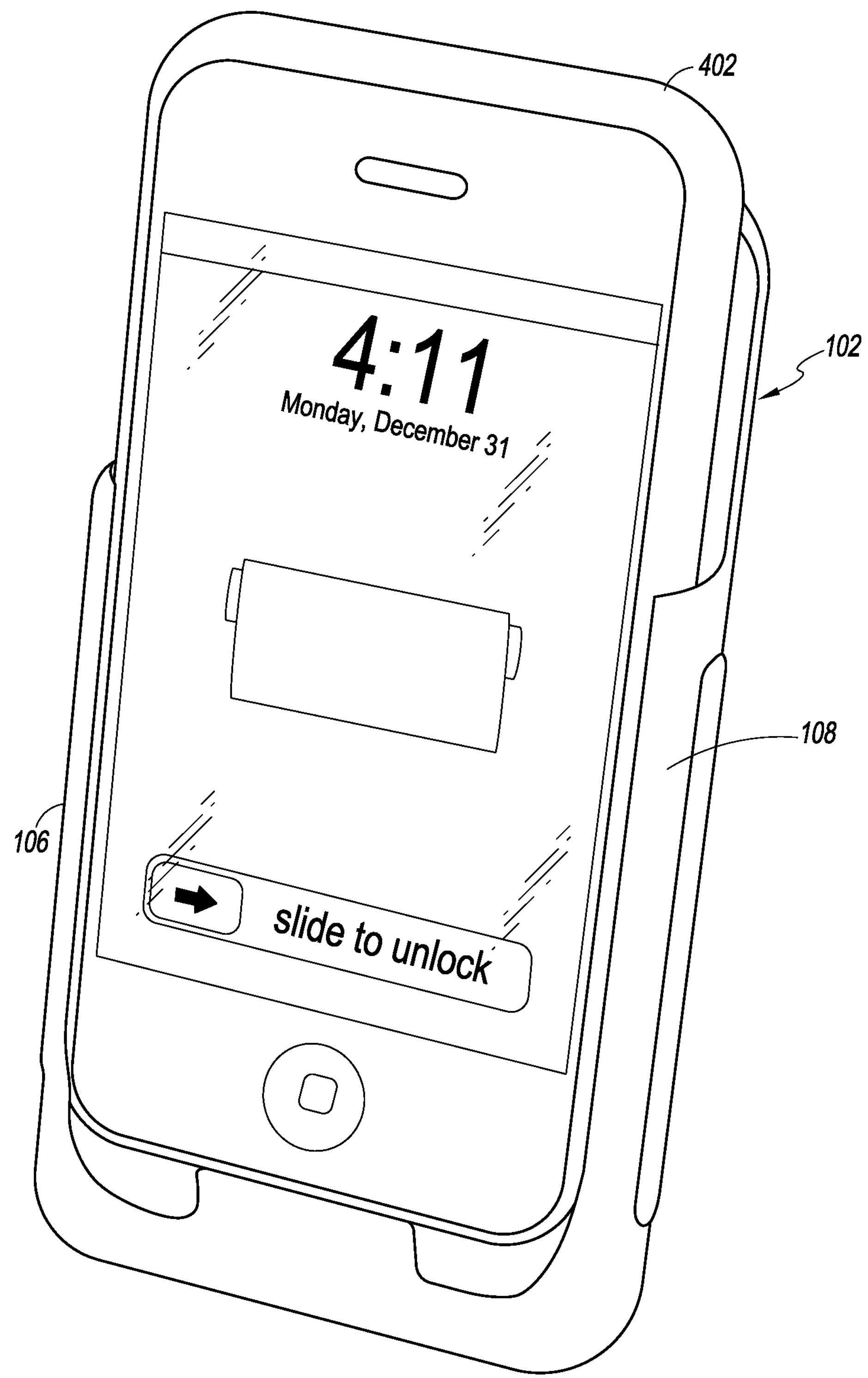
FIG. 4 illustrates the example battery pack of FIG. 1 and a mobile device.
Figure 5:
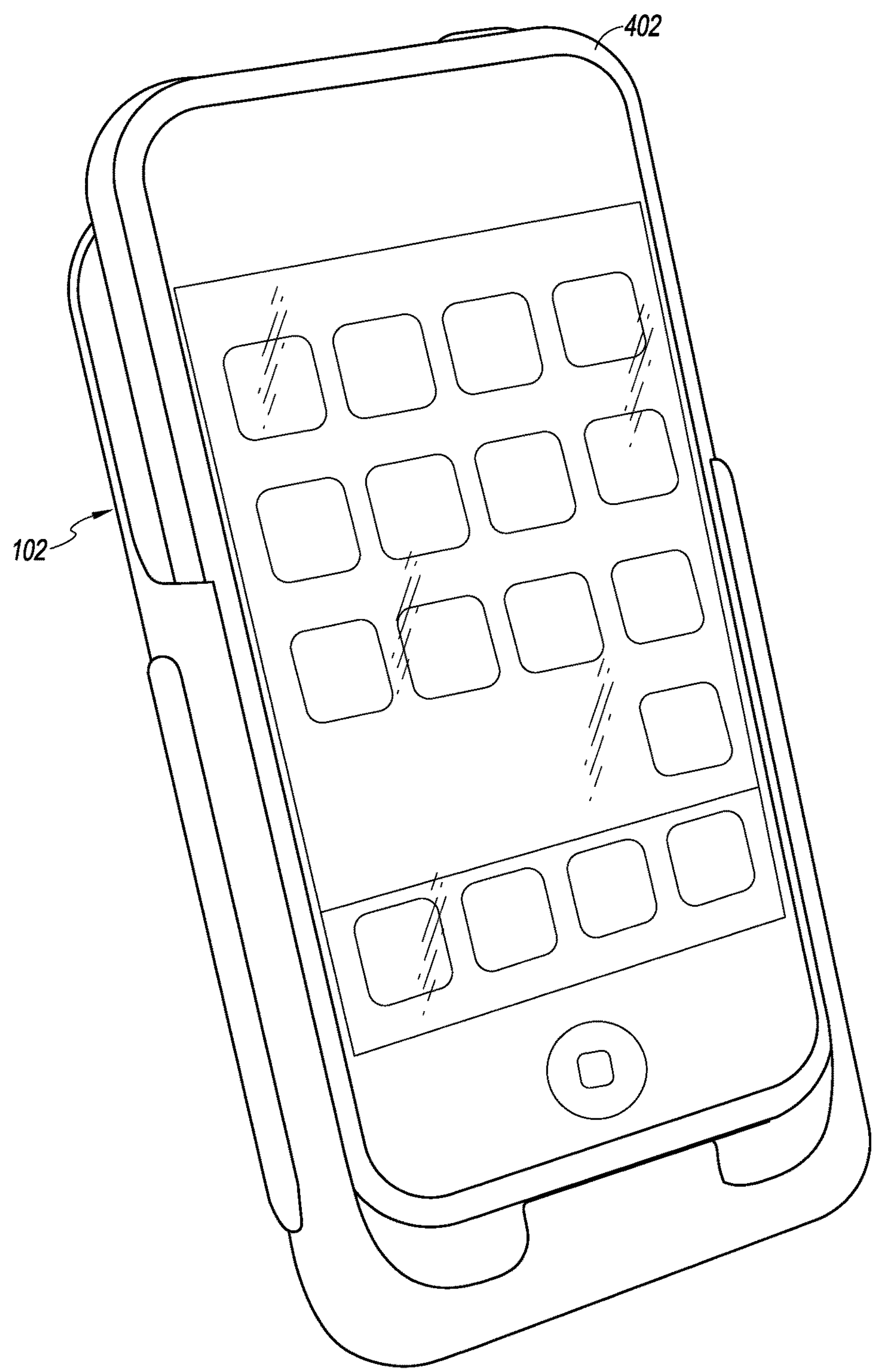
FIG. 5 illustrates the example battery pack of FIG. 1 and a mobile device.
Figure 6:
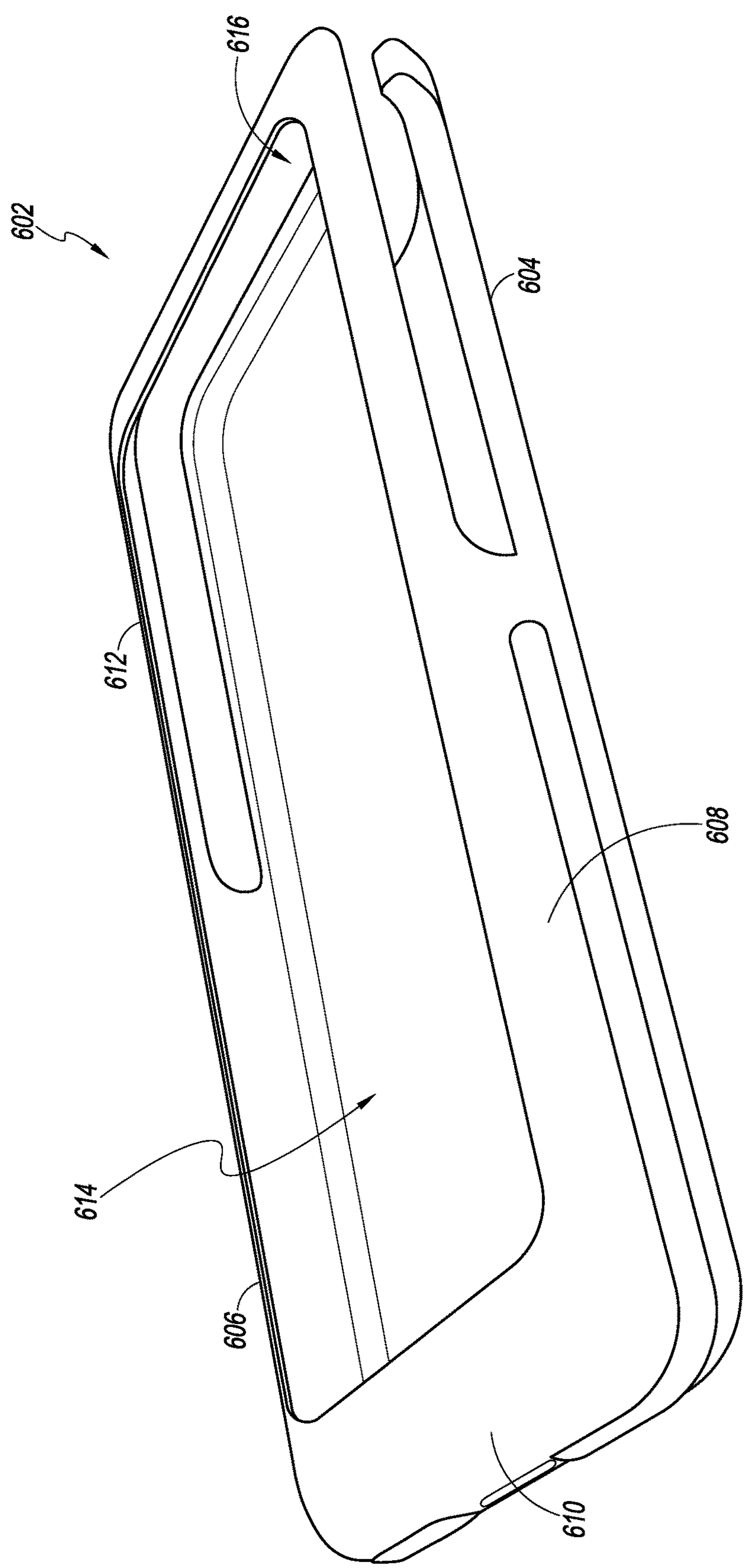
FIG. 6 illustrates an embodiment of a mobile device holster.
Figure 7:
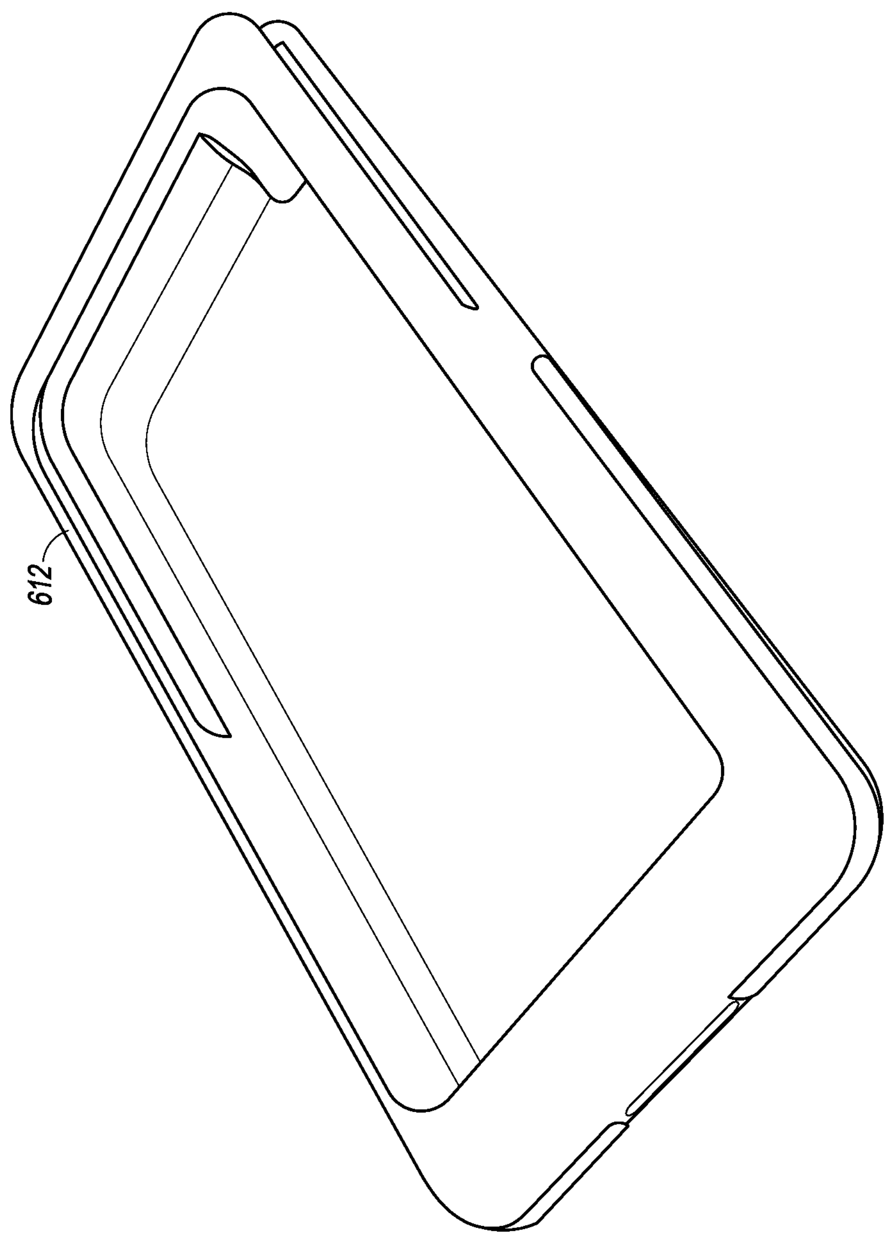
FIG. 7 illustrates the embodiment of a mobile device holster of FIG. 6.
Figure 8:
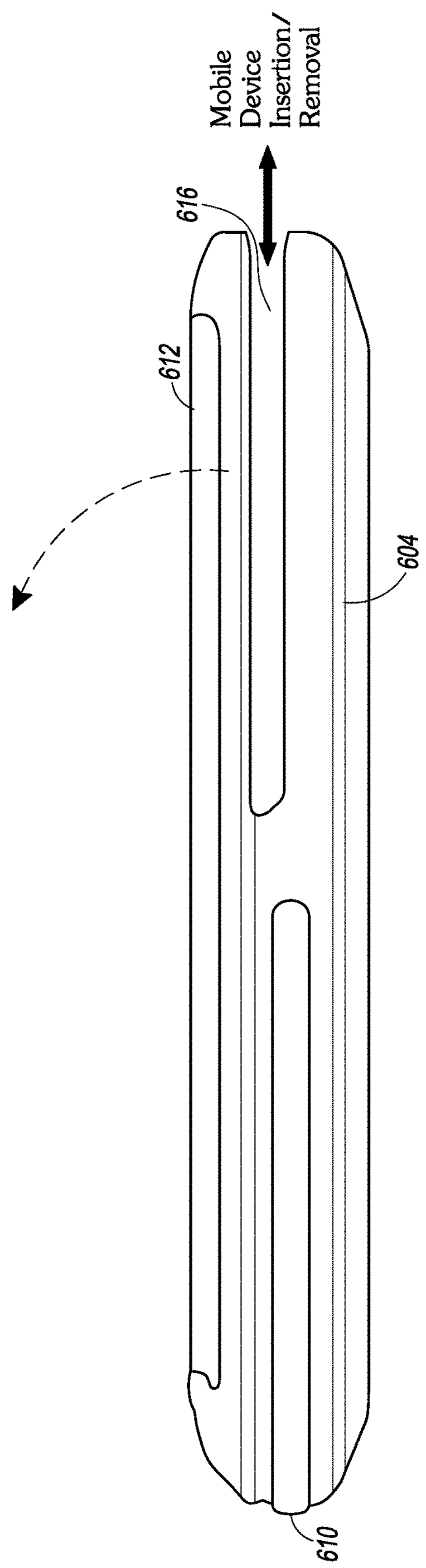
FIG. 8 illustrates the embodiment of a mobile device holster of FIG. 6.

FIGS. 4 and 5 illustrate two different side views of how one type of mobile device 402 (i.e., an iPhone™ by Apple Inc.) may be mounted or coupled to the battery pack 102. The mobile device 402 may slide into the battery pack 102 and may be held in place or attached by the first and second sides 106 and 108 and/or device interface 110.

Second Embodiment

FIGS. 6-9 illustrate an alternative embodiment of a mobile device holster. The holster 602 may include a back plane 604, a first and second sides 606 and 608, a bottom side 610, and an upper flange 612 which define a cavity 614 for housing a mobile device. An opening 616 may be defined between the upper flange 612 and the back plane 604. The upper flange 612 may flex (as denoted in FIG. 8) to allow the mobile device to be inserted through the opening 616 to insert the mobile device. Similarly, the upper flange 612 may flex back to allow the mobile device to be removed. The upper flange 612 and first and second sides 606 and 608 may be shaped to retain the mobile device when inserted into the holster 602. In one example, the holster 602 may include one or more interfaces that couple to the mobile device when the mobile device is housed within the holster. The interface act as a bridge to allow the mobile device to couple to an external device. For instance, the holster 602 may be adapted to be coupled to an external battery pack to provide power to the mobile device.

Figure 9:
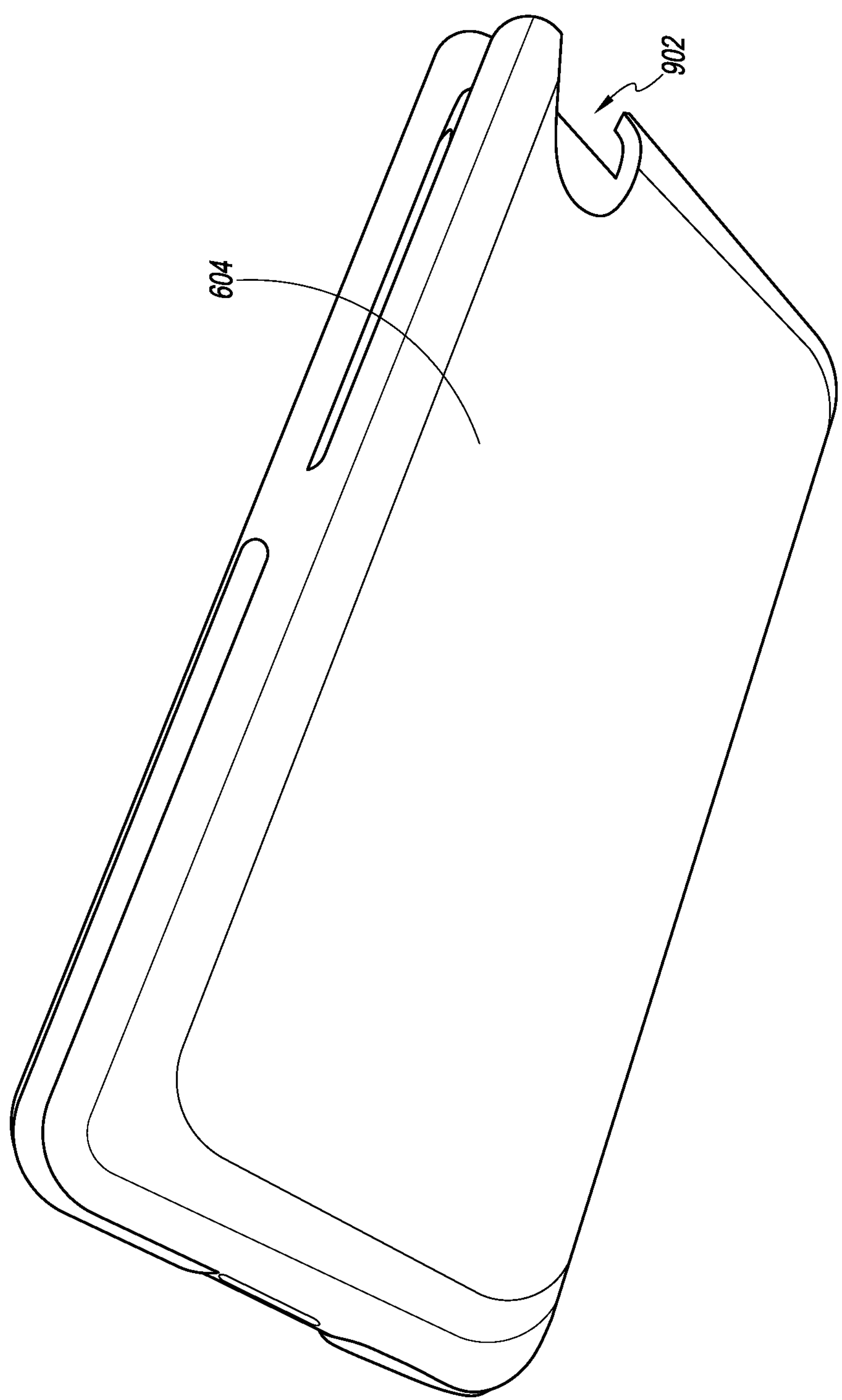
FIG. 9 illustrates the embodiment of a mobile device holster of FIG. 6.
Figure 10:
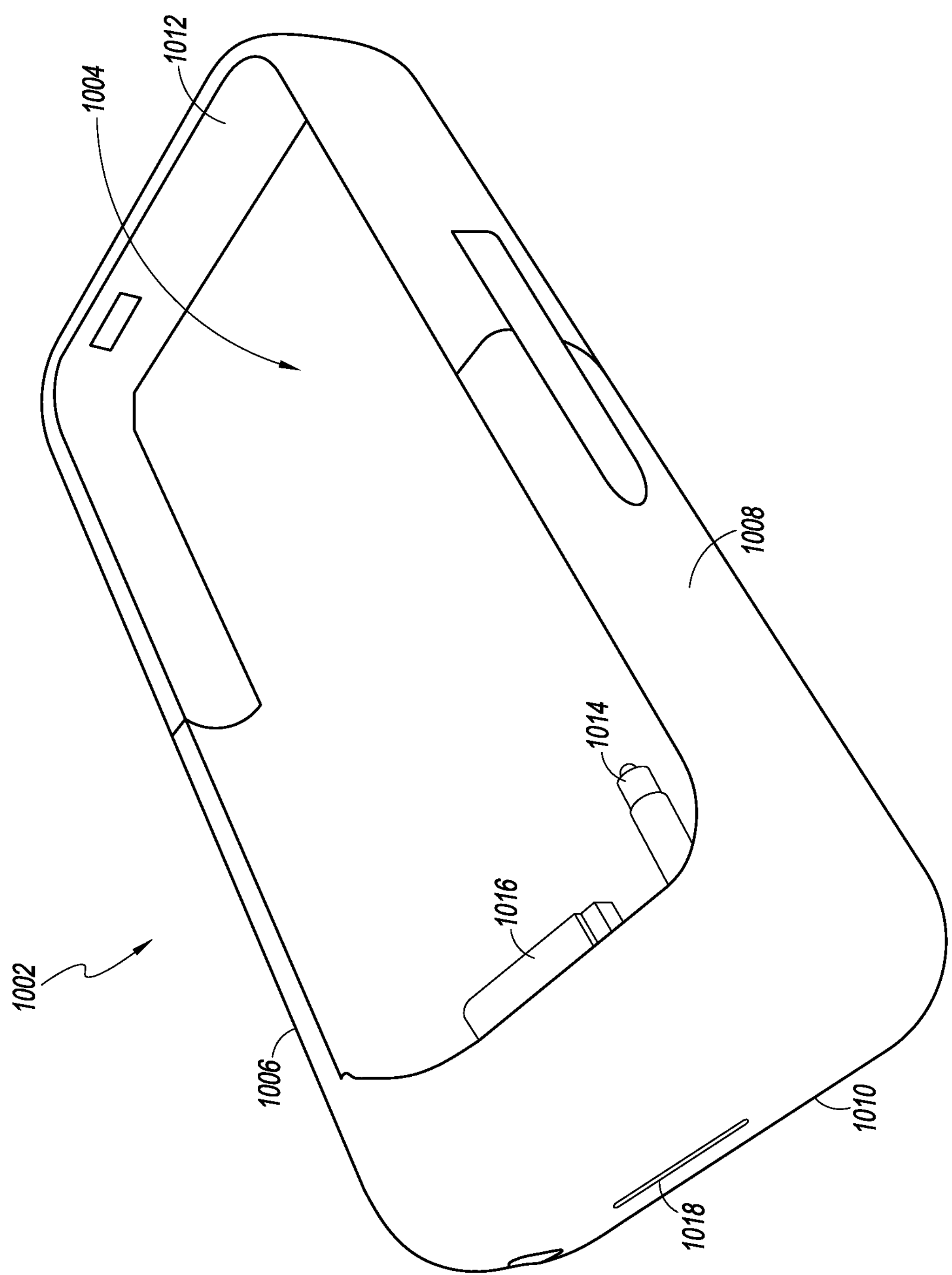
FIG. 10 illustrates an alternative embodiment of a battery pack.
Figure 11A:
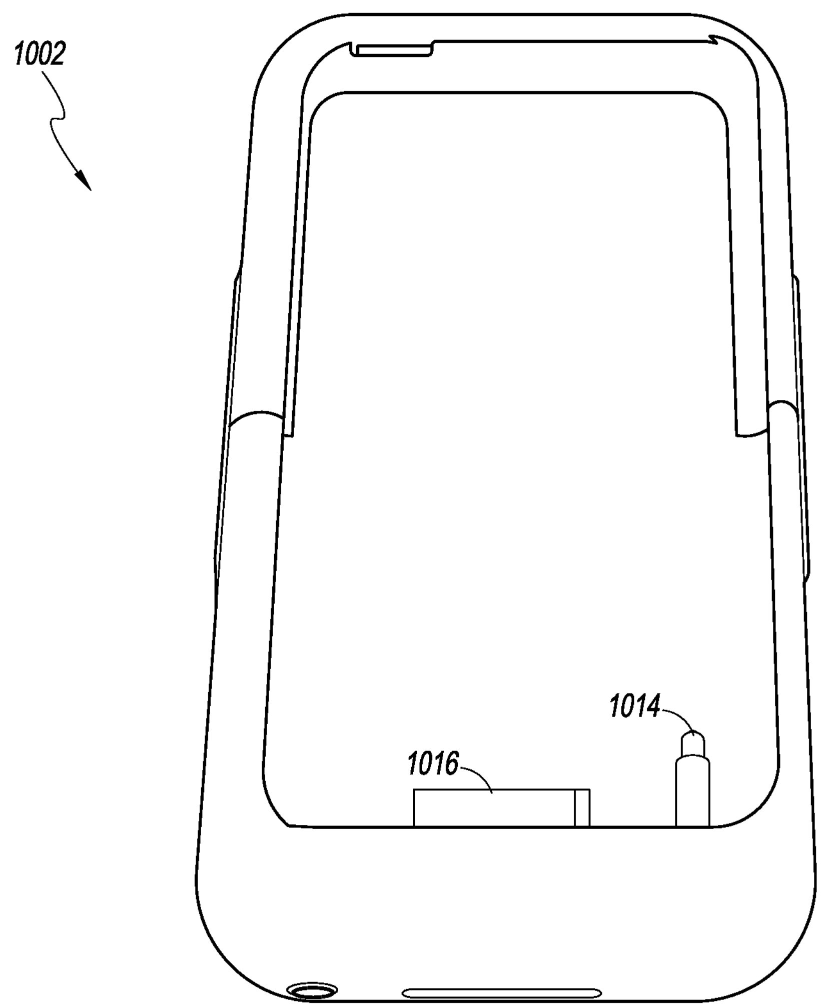
FIG. 11A illustrates the alternative embodiment of a battery pack of FIG. 10.
Figure 11B:
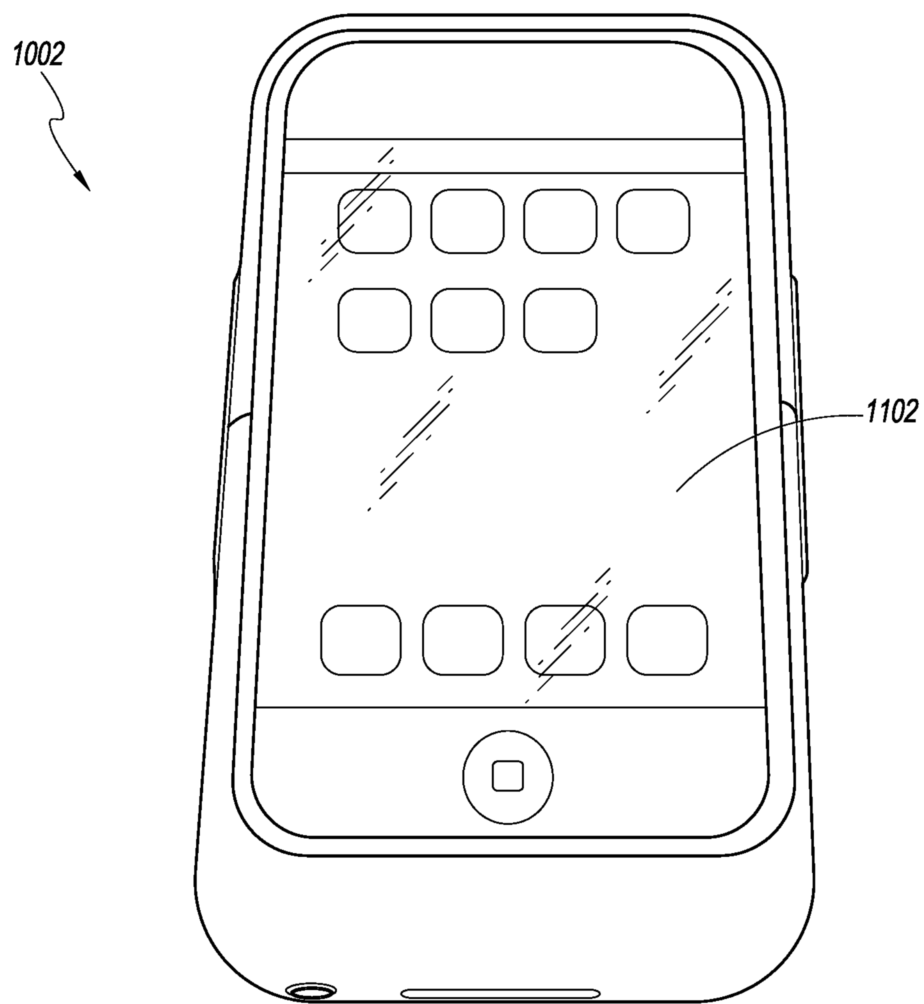
FIG. 11B illustrates the alternative embodiment of a battery pack of FIG. 10 and a mobile device.

In an alternative embodiment, the holster 602 may also include one or more rechargeable battery cells within the thickness of the back plane 604 that can power the mobile device via a device interface. FIG. 9 illustrates one example of a back view of the holster 612. An opening 902 may be formed on the back plane 604 to allow access to a reset or power button on the mobile device.

Third Embodiment

FIGS. 10-13 illustrate an alternative embodiment of a battery pack. The battery pack 1002 may include a back plane 1004, a first and second sides 1006 and 1008, a bottom side 1010, and an upper side 1012 which define a cavity 1004 for housing a mobile device. Additionally, the battery pack 1002 may include a first device interface 1014 and a second device interface 1016 (e.g., power connector, audio signals, control signal, data signals, etc.). In one embodiment, the second device interface 1016 may serve to provide power from one or more internal power cells (housed within the thickness of the back plane 1004). The internal power cells may be recharged via a third interface 1018 on the battery pack 1002. As illustrated in FIG. 11B, a mobile device 1102 may be inserted and housed by the battery pack 1002.

Figure 12A:
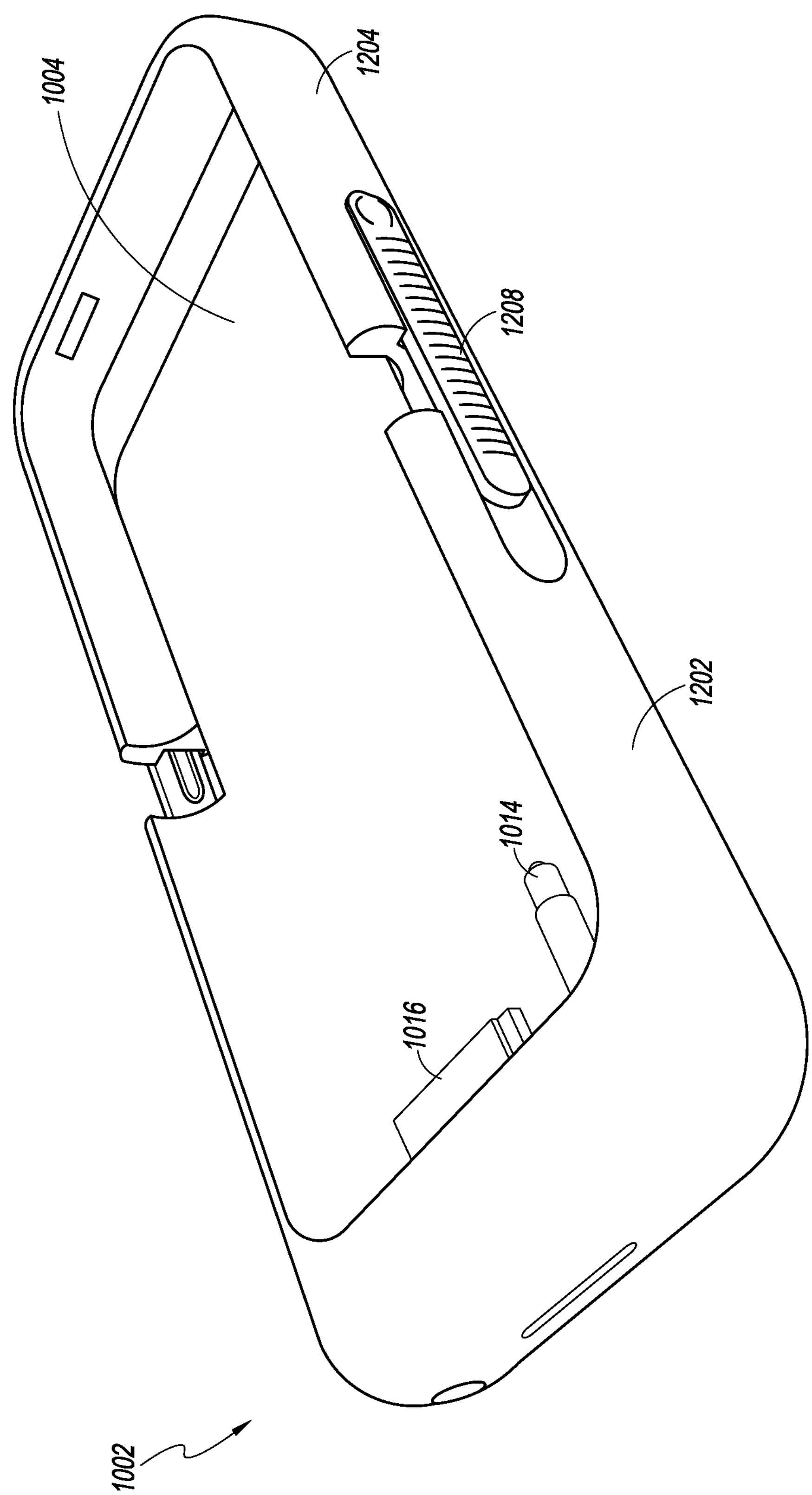
FIG. 12A illustrates the alternative embodiment of a battery pack of FIG. 10.
Figure 12B:
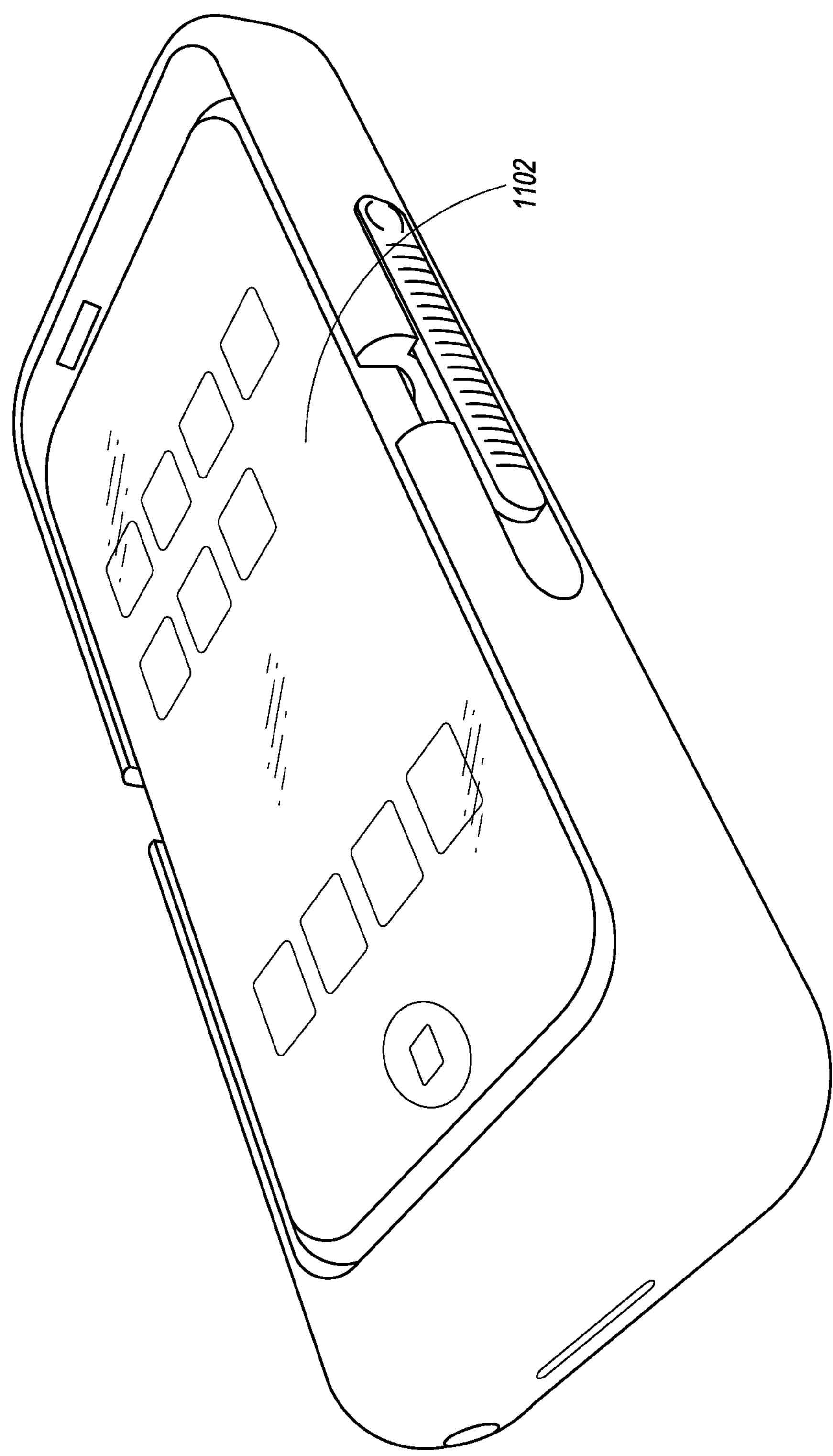
FIG. 12*b* illustrates the alternative embodiment of a battery pack of FIG. 10 and a mobile device.
Figure 13A:
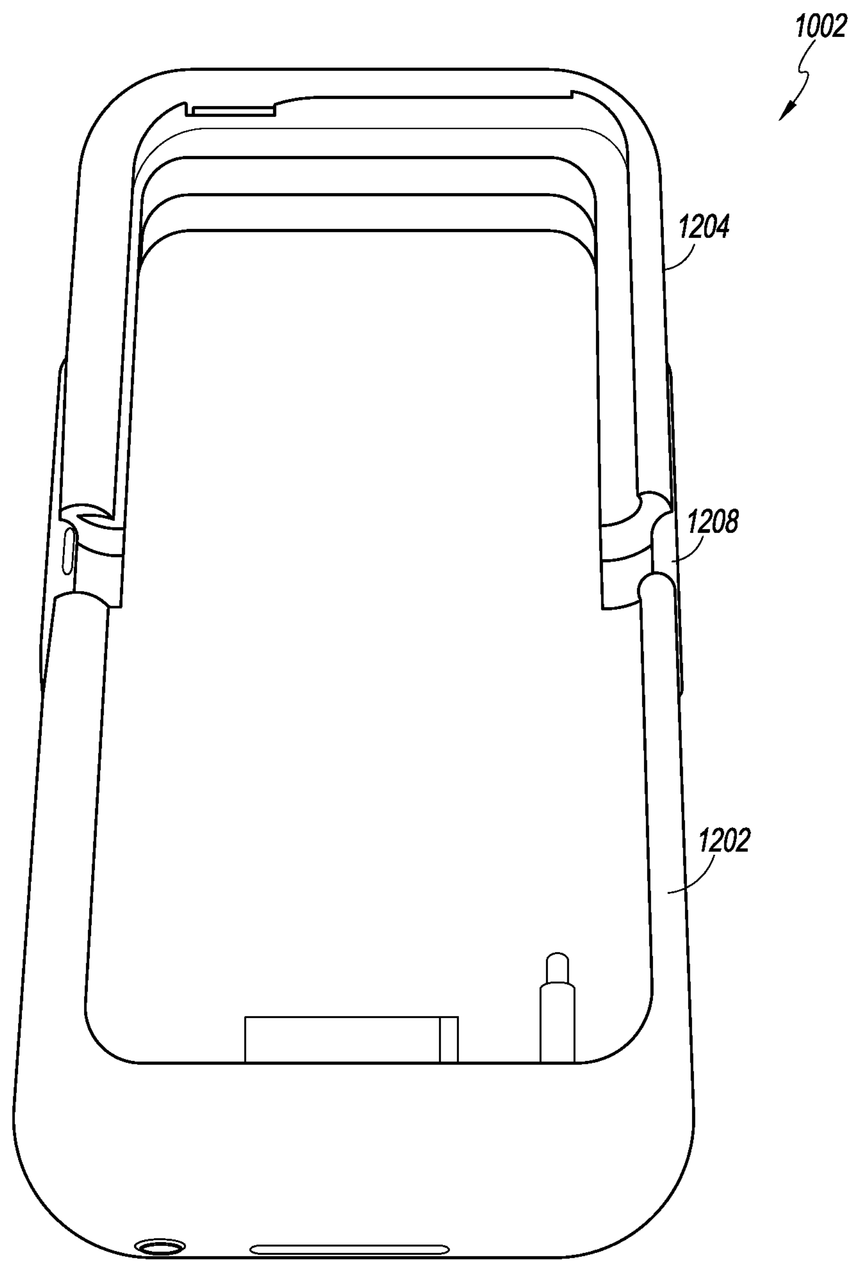
FIG. 13A illustrates the alternative embodiment of a battery pack of FIG. 10.
Figure 13B:
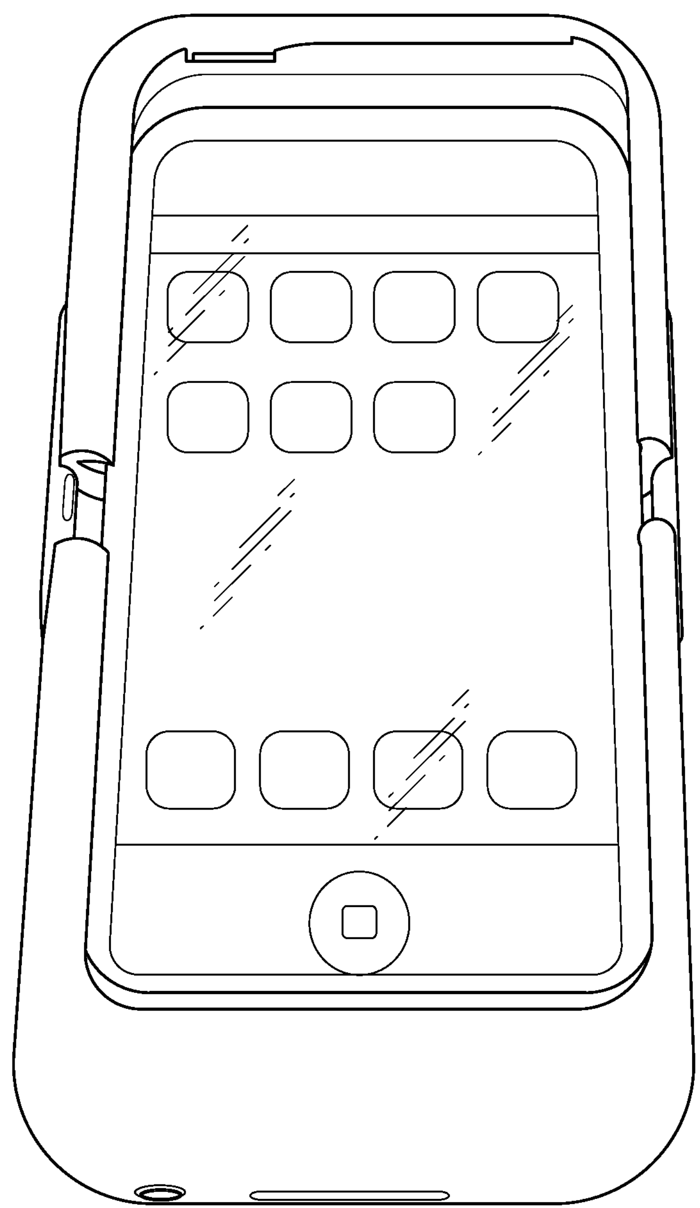
FIG. 13B illustrates the alternative embodiment of a battery pack of FIG. 10 and a mobile device.
Figure 14A:
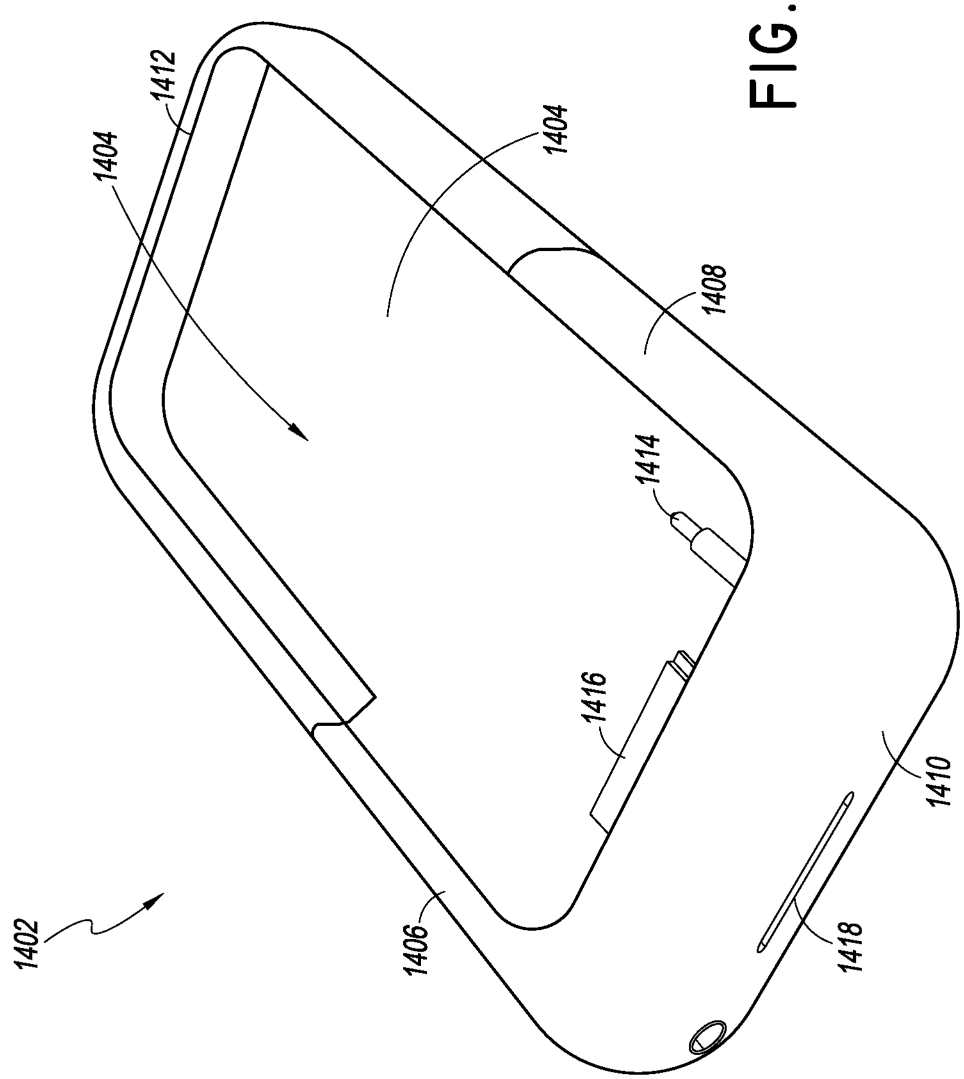
FIG. 14A illustrates an alternative embodiment of a battery pack.
Figure 14B:
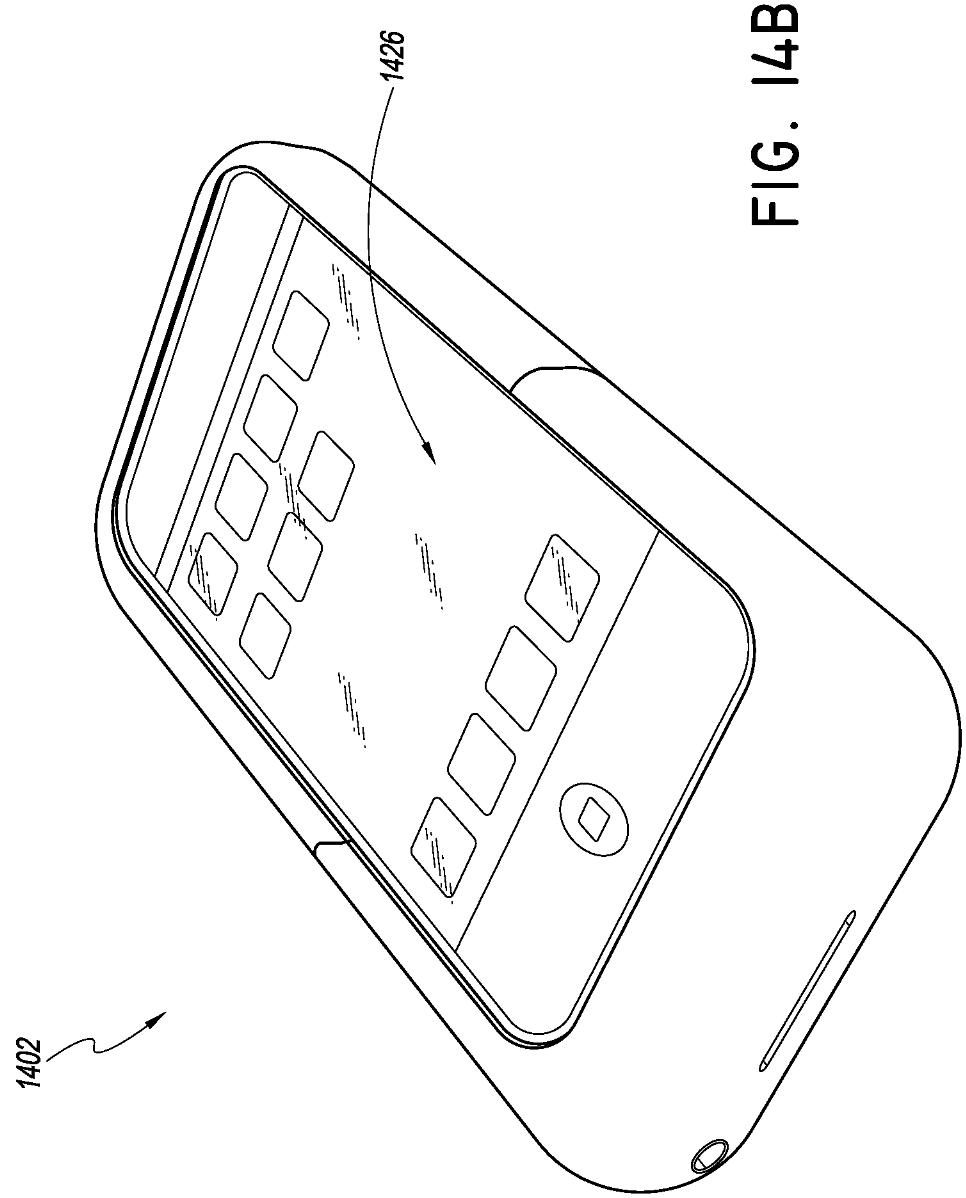
FIG. 14B illustrates the alternative embodiment of a battery pack of FIG. 14A and a mobile device.
Figure 15A:
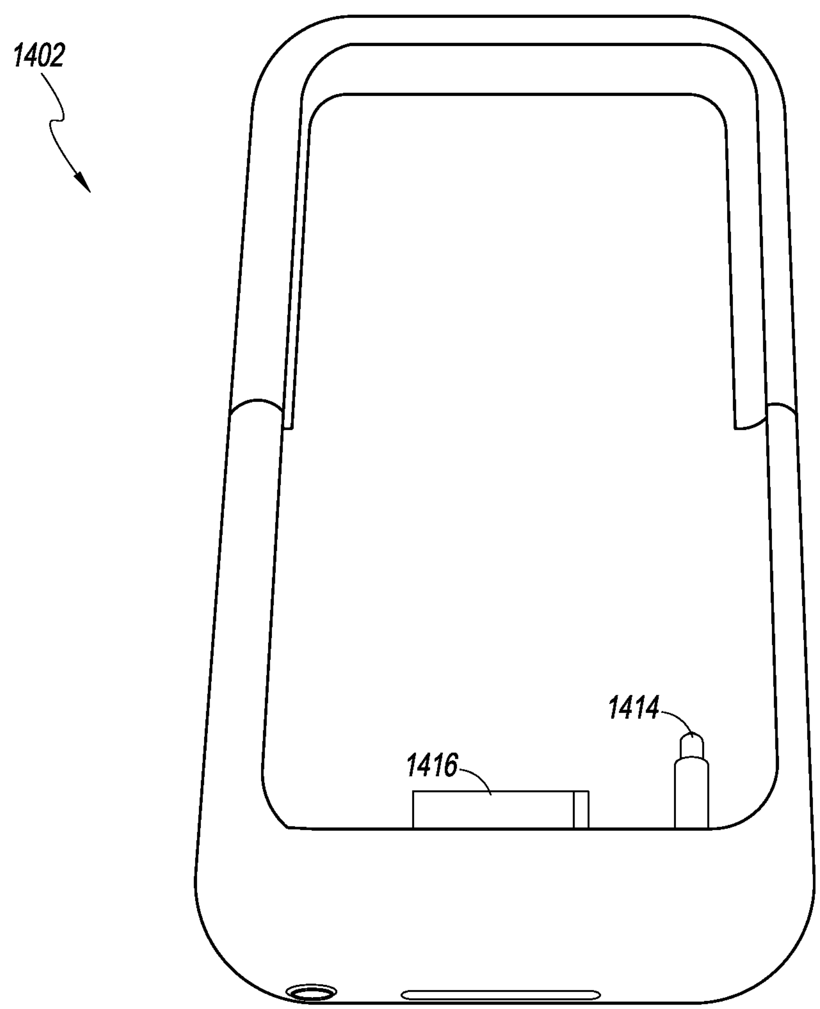
FIG. 15A illustrates the alternative embodiment of a battery pack of FIG. 14A.
Figure 15B:
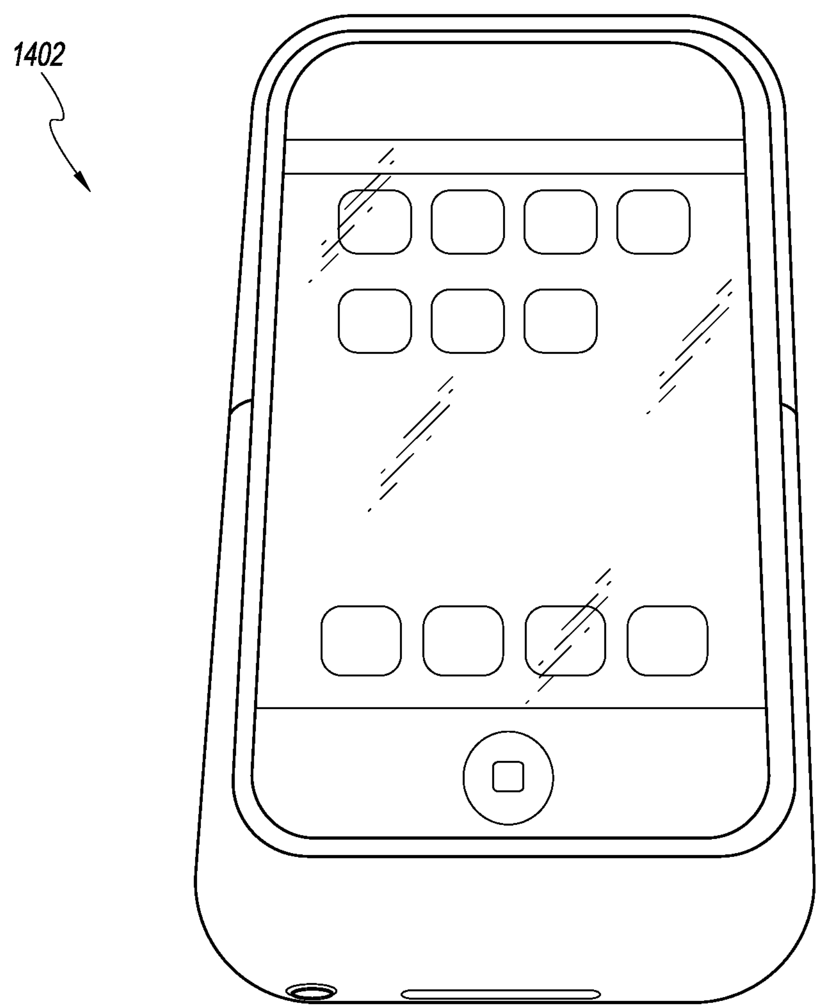
FIG. 15B illustrates the alternative embodiment of a battery pack of FIG. 14A and a mobile device.

FIGS. 12 and 13 illustrate how the battery pack 1002 may be adapted to allow the mobile device 1102 to be inserted or removed. An upper portion 1204 may be movably separated from a lower portion 1202 of the battery pack 1002. The upper portion 1204 may slide on guides 1208 on both sides to create a space which allows the mobile device 1102 to detach from the interfaces 1014 and/or 1016. Once detached, the mobile device may be removed. Similarly, the space created by the upper portion 1204 sliding away from the bottom portion 1202 allows the mobile device to be inserted into the battery pack 1002.

The guides 1208 may also act as a stopper to prevent the upper portion 1204 from completely separating from the bottom portion 1202 once a separation limit is reached. Similarly, the guides 1208 may also include locking tabs that secure or couple the upper portion 1204 and lower portion 1202 together when they are in a closed position.

Fourth Embodiment

FIGS. 14-18 illustrate an alternative embodiment of a battery pack. The battery pack 1402 may include a back plane 1404, a first and second sides 1406 and 1408, a bottom side 1410, and an upper side 1412 which define a cavity 1404 for housing a mobile device 1426. Additionally, the battery pack 1402 may include a first device interface 1414 and a second device interface 1416 (e.g., power connector, audio signals, control signal, data signals, etc.). In one embodiment, the second device interface 1416 may serve to provide power from one or more internal power cells (housed within the thickness of the back plane 1404). The internal power cells may be recharged via a third interface 1418 on the battery pack 1402. As illustrated in FIG. 14B, a mobile device 1426 may be inserted and housed by the battery pack 1402.

Figure 16A:
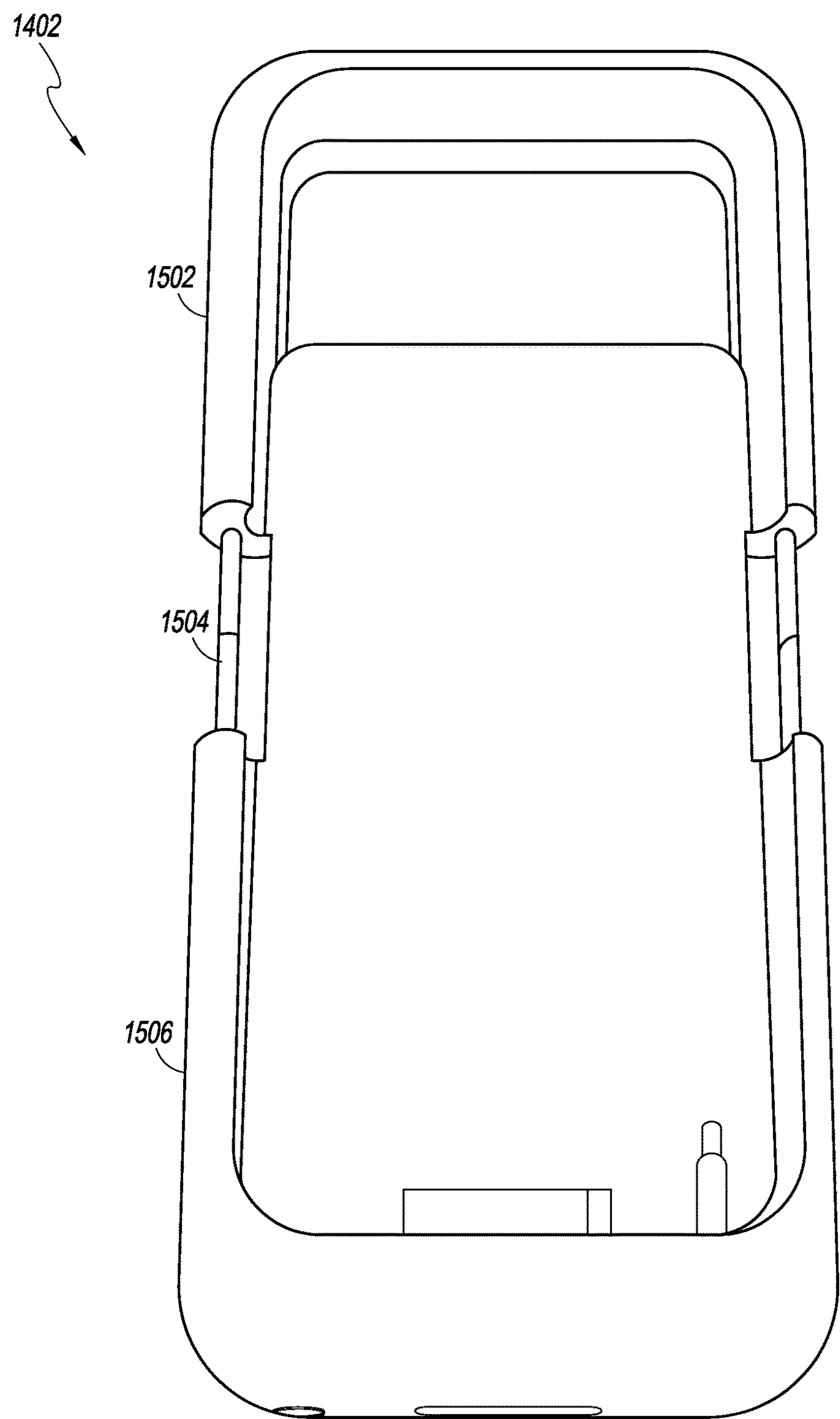
FIG. 16A illustrates the alternative embodiment of a battery pack of FIG. 14A.
Figure 16B:
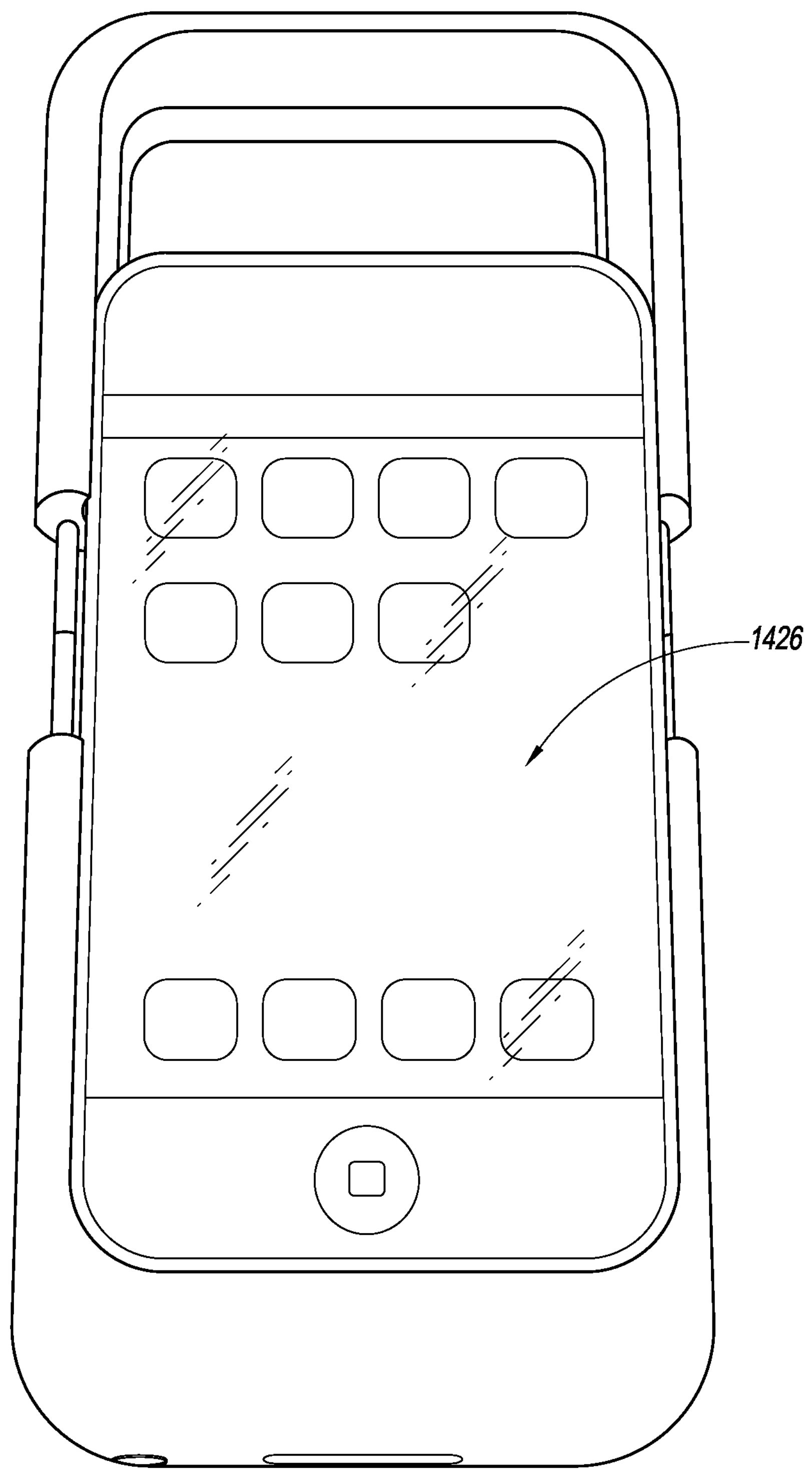
FIG. 16B illustrates the alternative embodiment of a battery pack of FIG. 14A and a mobile device.
Figure 17A:
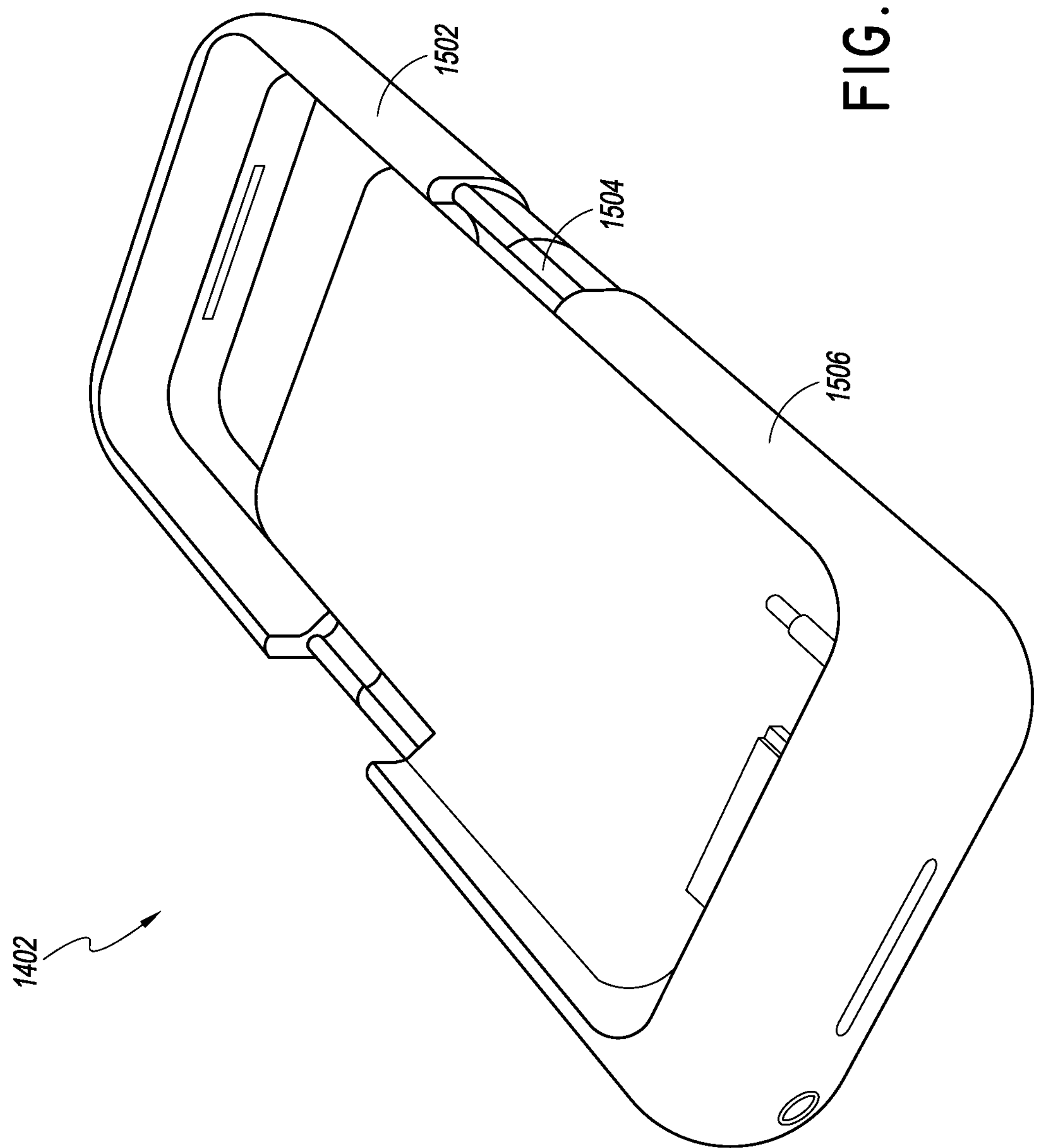
FIG. 17A illustrates the alternative embodiment of a battery pack of FIG. 14A.
Figure 17B:
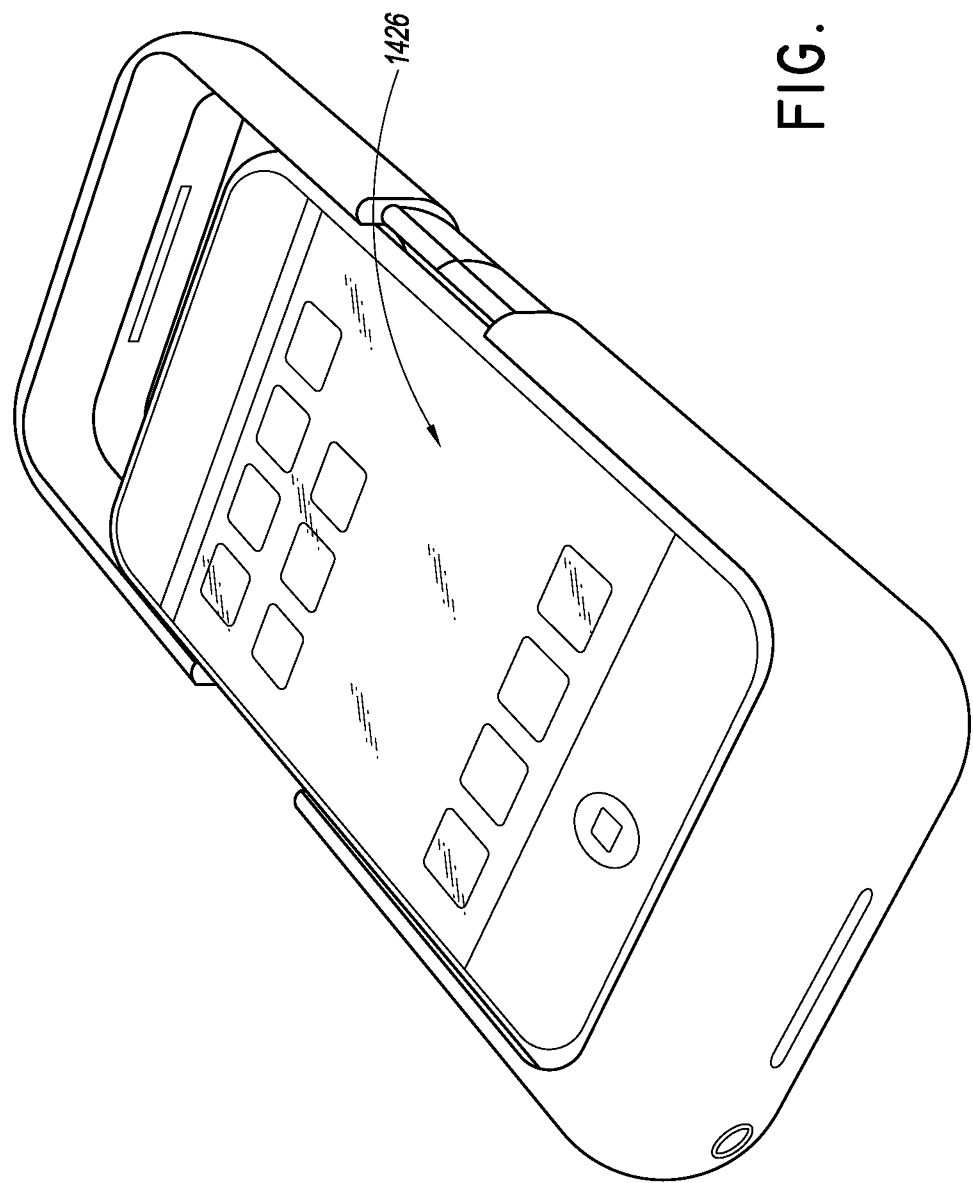
FIG. 17B illustrates the alternative embodiment of a battery pack of FIG. 14A and a mobile device.
Figure 18B:
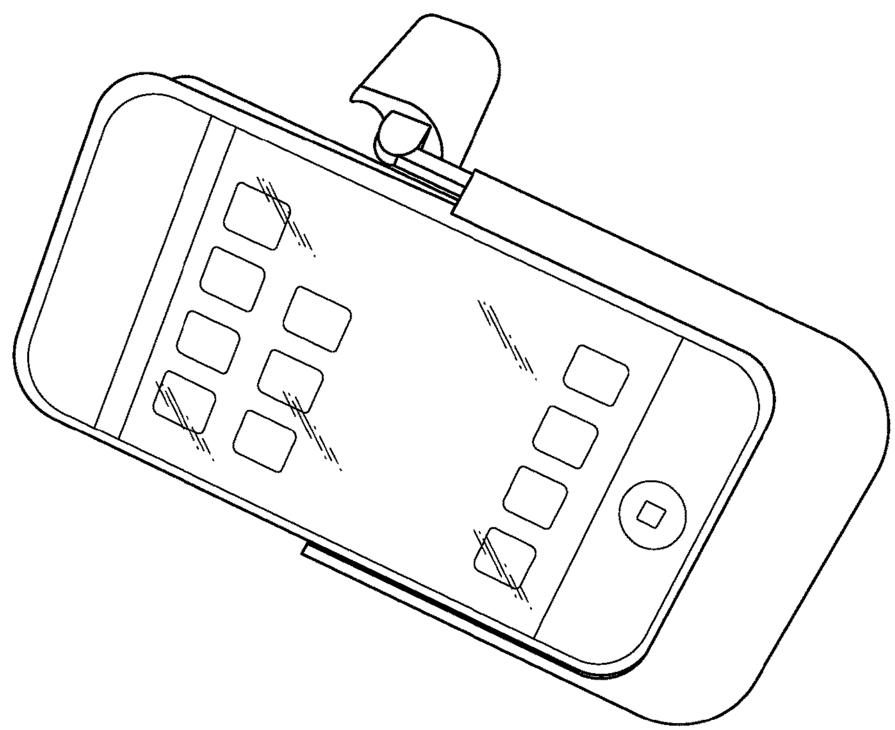
FIG. 18B illustrates the alternative embodiment of a battery pack of FIG. 14A and a mobile device.
Figure 18A:
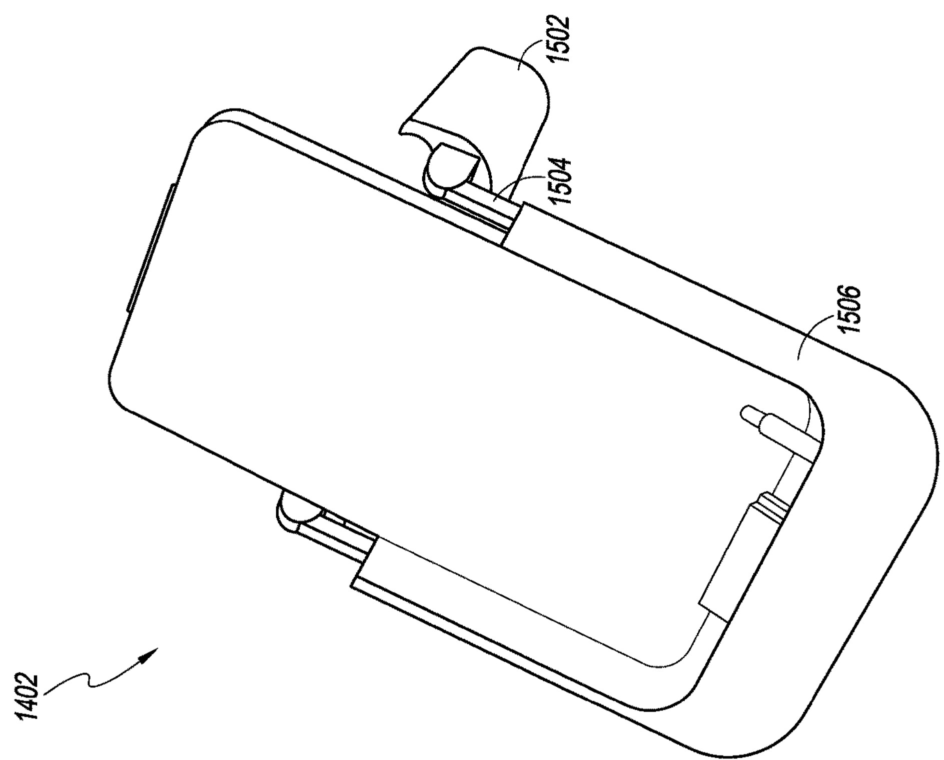
FIG. 18A illustrates the alternative embodiment of a battery pack of FIG. 14A.

FIGS. 16, 17, and 18 illustrate how the battery pack 1402 may be adapted to allow the mobile device 1426 to be inserted or removed. An upper portion 1502 may be movably separated from a lower portion 1506 of the battery pack 1402. The upper portion 1502 may slide on guides 1504 on both sides to create a space which allows the mobile device 1426 to detach from the interfaces 1414 and/or 1416. Once detached, the mobile device 1426 may be removed. Similarly, the space created by the upper portion 1502 sliding away from the bottom portion 1506 allows the mobile device to be inserted into the battery pack 1402.

To make it easier to insert and/or remove the mobile device 1426 from the battery pack 1402, the guides 1504 may include hinge points that allow the upper portion 1502 to fold relative to the bottom portion 1506, thereby allowing the mobile device 1426 to be removed or inserted with greater ease.

Speakers & Microphone

Another feature may provide for one or more speakers to be included as part of the battery packs or holster (illustrated in FIGS. 1-18). For instance a low-profile speaker may be housed within the back plane of a battery pack so that the sound may be emitted from the rear or sides of the battery pack. When a mobile device is inserted and coupled to the battery pack, it couples to an interface that electrically connects the speaker to the mobile device. The mobile device may send audio or sound signals to the speaker via an interface with the battery pack. This allows a user to listen to audio stored in the mobile device without the need for headphones.

Similarly, another feature may provide for one or more microphones to be included as part of the battery packs (illustrated in FIGS. 1-18). One or more microphones may be housed within the battery pack (e.g., back plane) so that they may capture sound from a user. The microphone may be electrically coupled to an interface that allows sending captured audio signals to a mobile device that may be coupled to the battery pack.

ADDITIONAL FEATURES

In some embodiments the back plane of the battery packs and/or holster of FIGS. 1-18 may house additional devices.

For example, the rear of the back plane may house an additional display screen extend the screen on the mobile device. The additional display screen may be electrically coupled to the mobile device (via an interface) to allow the mobile device to send images or video to the additional display screen.

In another example, the rear of the back plane may house a Braille input and/or output interface that electrically coupled a mobile device mounted within the holster or battery pack.

In yet another embodiment, the rear of the back plane may provide a keypad that serves as an input to the mobile device.

According to another feature, the battery pack and/or holster may provide an external interface (e.g., Bluetooth wireless interface, USB port, infrared port, etc.) that may allow the mobile device mounted in the battery pack and/or holster to communicate via that external interface. Thus the external interface may provide a different wireless interface than provided or supported by the internal system of the mobile device.

One or more of the features illustrated in FIGS. 1-18 may be rearranged and/or combined into a single component or embodied in several components. Additional components may also be added without departing from the invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The following is claimed:

1. A battery case for use with a mobile electronic device, the battery case comprising:

a battery;

a back wall configured to be positioned against at least a portion of a back side of a mobile electronic device;

an external interface configured to recharge the battery;

a bottom case portion comprising:

a bottom wall configured to be positioned adjacent to at least a portion of a bottom of a mobile electronic device; and a device interface configured to engage a corresponding interface on the mobile electronic device, wherein the battery is coupled to the device interface so that electrical power may be provided to the mobile electronic device through the device interface;

an upper case portion comprising an upper wall configured to be positioned adjacent to at least a portion of a top of the mobile electronic device;

guides configured to enable the bottom case portion and the upper case portion to slide apart to an open configuration and to slide together to a closed configuration, wherein the device interface is configured to be attached to the corresponding interface on the mobile electronic device when the battery case is in the closed configuration with the mobile electronic device in the battery case, wherein the open configuration provides sufficient space for the mobile electronic device to detach from the device interface for removal of the mobile electronic device from the battery case, wherein the open configuration provides sufficient space for insertion of the mobile electronic device into the battery case, wherein the sufficient space for removal or insertion of the mobile electronic device is created by the upper case portion sliding away from the bottom case portion, and wherein the upper case portion does not rotate relative to the bottom case portion; and a stopper configured to prevent the upper case portion from completely separating from the bottom case portion once a separation limit is reached.

2. The battery case of claim 1, wherein the device interface is configured to permit transfer of data to or from the mobile electronic device, and wherein the external interface is configured to enable the mobile electronic device to communicate with an external device.

3. The battery case of claim 1, wherein the device interface extends upward from the bottom wall.

4. The battery case of claim 1, comprising a front opening configured such that a display of the mobile electronic device is visible through the front opening.

5. The battery case of claim 1, wherein the battery is housed within a thickness of the back wall.

6. The battery case of claim 1, further comprising a charge indicator configured to indicate the charge status of the battery.

7. The battery case of claim 6, wherein the charge indicator is disposed on a back side of the battery case.

8. The battery case of claim 1, wherein the external interface comprises a USB port.

9. The battery case of claim 1, wherein the battery case is configured to receive a mobile phone.

10. The battery case of claim 9, wherein the battery case is shaped to conform to the external shape of the mobile phone without significantly affecting the usability of the mobile phone.

11. The battery case of claim 1, wherein the bottom case portion comprises a bottom portion of a right side wall configured to be positioned adjacent to a lower portion of a right side of the mobile electronic device, wherein the bottom case portion comprises a bottom portion of a left side wall configured to be positioned adjacent to a lower portion of a left side of the mobile electronic device, wherein the upper case portion comprises an upper right side wall configured to be positioned adjacent to an upper portion of a right side of the mobile electronic device, and wherein the upper case portion comprises an upper left side wall configured to be positioned adjacent to an upper portion of a left side of the mobile electronic device.

12. The battery case of claim 1, further comprising:

a right side wall configured to extend adjacent to at least a portion of a right side of the mobile electronic device; and a left side wall configured to extend adjacent to at least a portion of a left side of the mobile electronic device;

wherein the bottom wall, the upper wall, the right side wall, and the left side wall together cover at least a majority of a perimeter of the mobile electronic device formed by the bottom, the top, the right side, and the left side of the mobile electronic device.

13. The battery case of claim 1, wherein the bottom case portion and the upper case portion slide apart along a single linear direction to provide the sufficient space for removal or insertion of the mobile electronic device.

14. A battery case for use with a mobile electronic device, the battery case comprising:

a back wall configured to extend adjacent to at least a portion of a back side of a mobile electronic device;

a battery;

a bottom wall configured to extend adjacent to at least a portion of a bottom of the mobile electronic device;

an upper wall configured to extend adjacent to at least a portion of a top of the mobile electronic device;

a right side wall configured to extend adjacent to at least a portion of a right side of the mobile electronic device;

a left side wall configured to extend adjacent to at least a portion of a left side of the mobile electronic device;

a front opening configured such that a display of the mobile electronic device is visible through the front opening;

a device interface extending from the bottom wall towards the upper wall and configured to engage a corresponding interface on the mobile electronic device, wherein the battery is coupled to the device interface to provide electrical power to the mobile electronic device through the device interface;

an external interface configured to recharge the battery;

a movable portion that includes the device interface and is configured to slide apart from the upper wall along a single linear direction to provide sufficient space between the device interface and the upper wall for the mobile electronic device to detach from the device interface for removal of the mobile electronic device from the battery case and to provide sufficient space for insertion of the mobile electronic device into the battery case, wherein the sufficient space for removal or insertion of the mobile electronic device is created by the movable portion sliding away from the upper wall in the single linear direction; and a stopper configured to prevent the movable portion from completely separating from a remainder of the battery case once a separation limit is reached;

wherein the bottom wall, the upper wall, the right side wall, and the left side wall together cover at least a majority of a perimeter of the mobile electronic device formed by the bottom, the top, the right side, and the left side of the mobile electronic device.

15. The battery case of claim 14, wherein the battery is housed within a thickness of the back wall.

16. The battery case of claim 14, wherein the device interface is configured to permit transfer of data to or from the mobile electronic device, and wherein the external interface is configured to enable the mobile electronic device to communicate with an external device.

17. The battery case of claim 14, comprising guides configured to enable the movable portion to slide away from the upper wall.

18. The battery case of claim 14, further comprising a charge indicator configured to indicate the charge status of the battery.

19. The battery case of claim 18, wherein the charge indicator is disposed on a back side of the back wall.

20. The battery case of claim 14, wherein the external interface comprises a USB port.

21. The battery case of claim 14, wherein the battery case is configured to receive a mobile phone.

22. The battery case of claim 21, wherein the battery case is shaped to conform to the external shape of the mobile phone without significantly affecting the usability of the mobile phone.

23. The battery case of claim 14, comprising an upper case portion that includes the upper wall and a bottom case portion that includes the bottom wall, wherein the upper case portion does not rotate relative to the bottom case portion.

* * * * *